United States Patent [19]
Morishita et al.

[11] Patent Number: 5,917,765
[45] Date of Patent: Jun. 29, 1999

[54] SEMICONDUCTOR MEMORY DEVICE CAPABLE OF BURN IN MODE OPERATION

[75] Inventors: Fukashi Morishita; Masaki Tsukude, both of Hyogo, Japan

[73] Assignee: Mitsubishi Denki Kabushiki Kaisha, Tokyo, Japan

[21] Appl. No.: 08/951,591

[22] Filed: Oct. 16, 1997

[30] Foreign Application Priority Data

Mar. 27, 1997 [JP] Japan ................................. 9-076161

[51] Int. Cl.$^6$ .................................................. G11C 13/00
[52] U.S. Cl. ............................................................. 365/201
[58] Field of Search .................................. 365/201, 206, 365/189.07, 189.09, 226

[56] References Cited

U.S. PATENT DOCUMENTS 5,363,333  11/1994  Tsujimoto ............................... 365/201
5,554,953   9/1996  Shibayama et al. ..................... 327/541

FOREIGN PATENT DOCUMENTS 4-205887  7/1992  Japan .
4-243098  8/1992  Japan .
6-21376   1/1994  Japan .

OTHER PUBLICATIONS

ULSI DRAM Technology, published by Science Forum Co., Ltd. Sep. 25, 1992.

Advanced Electronics I–9 VLSI Memory, published by Baifu–kan Co., Ltd., Nov. 5, 1994.

*Primary Examiner*—David Nelms
*Assistant Examiner*—Anh Phung
*Attorney, Agent, or Firm*—McDermott, Will & Emery

[57] ABSTRACT

A semiconductor integrated circuit device realizing high speed operation and low current consumption and ensure reliability evaluation is provided. Reference voltage generating circuits for generating reference voltages of mutually different voltage levels are provided for power supply pads respectively, and voltage down converters for down converting power supply voltages of corresponding external power supply pads to corresponding reference voltage levels and transmitting the lowered voltages to corresponding internal power supply lines are provided corresponding to respective reference voltage generating circuits. Further, a switching transistor is provided at an output node of the reference voltage generating circuit which is rendered conductive at a stress acceleration mode for connecting the corresponding external power supply pad to the output node of the corresponding reference voltage generating circuit.

15 Claims, 12 Drawing Sheets

SEMICONDUCTOR MEMORY DEVICE CAPABLE OF BURN IN MODE OPERATION

CROSS REFERENCE TO RELATED APPLICATION

This application is related to application of Ser. No. 08/779,186, filed Jan. 6, 1997, now U.S. Pat. No. 5,694,364.

BACKGROUND OF THE INVENTION

1. Field of the Invention

The present invention relates to a semiconductor integrated circuit device, and, more specifically, to a semiconductor integrated circuit device having a voltage down converter for internally down converting an external power supply voltage to generate an internal power supply voltage. More specifically, the present invention relates to a structure for reliability evaluation test of a semiconductor integrated circuit device having an internal voltage down converter.

2. Description of the Background Art

As the storage capacity of a semiconductor device has been increased, MOS transistors (insulated gate type field effect transistors) constituting the memory device has been reduced in size. In view of reliability, high speed operation and lower power consumption of such miniaturized elements, lower operational power supply voltage is desirable. However, in a system employing such a semiconductor memory device, system power supply voltage is higher than the operational power supply voltage of such semiconductor memory device, in consideration of power supply voltages of processors and the like and compatability with memory devices of former generation. In order to generate an internal power supply voltage having a necessary voltage level for the semiconductor memory device from an external power supply voltage which is, for example, the system power supply voltage, a circuit called a voltage down converter is used for lowering the external power supply voltage and for supplying internal power supply voltage necessary for the memory operation in the semiconductor memory device. By using such a voltage down converter, power supply voltage of the semiconductor memory device is reduced and reliability of the device is ensured.

FIG. 20 schematically shows the overall structure of a conventional semiconductor integrated circuit. Referring to FIG. 20, a semiconductor memory device 900 is shown as an example of the semiconductor integrated circuit device. Semiconductor memory device 900 includes a voltage down converter 905 for lowering an external power supply voltage extVcc which is, for example, the system power supply voltage, to a prescribed voltage level to generate an internal power supply voltage intVcc on an internal power supply line 904, and a memory circuit 908 which operates using the internal power supply voltage intVcc on internal power supply line 904 and a ground voltage Vss applied through ground terminal 906 to a ground line 907 as both operational power supply voltages. Memory circuit 908 includes a plurality of memory cells each storing information and peripheral circuitry for accessing the memory cells.

By lowering external power supply voltage extVcc to generate internal power supply voltage intVcc using voltage down converter 905, it becomes possible to operate memory circuit 908 stably with low power consumption.

FIG. 21 schematically shows the structure of voltage down converter 905 shown in FIG. 20. Referring to FIG. 21, voltage down converter 905 includes a reference voltage generating circuit 905a generating a reference voltage Vref which has small dependency on external power supply voltage extVcc; a comparing circuit 905b which operates using power supply voltage extVcc on external power supply line 902 as one operational power supply voltage and compares the reference voltage Vref with the internal power supply voltage intVcc on internal power supply line 904; and a p channel MOS transistor 905c provided between external power supply line 902 and internal power supply line 904 for supplying current from external power supply line 902 to internal power supply line 904 in accordance with an output signal from comparing circuit 905b. Comparing circuit 905 consists of a differential amplifier receiving the internal power supply voltage intVcc at its positive input and reference voltage Vref at its negative input.

Voltage down converter 905 further includes a p channel MOS transistor 905d responsive to activation of a stress acceleration mode designating signal /STR for electrically connecting external power supply line 902 to Ian output node 905ab of reference voltage generating circuit 905a. The stress acceleration mode will be described later.

Stabilizing capacitors 909a and 909b for stabilizing voltages are provided for external power supply line 902 and internal power supply line 904, respectively. The operation will be briefly described in the following.

When internal power supply voltage intVcc is higher than the reference voltage Vref, the output signal of comparing circuit 905b is at an H level, p channel MOS transistor 905c is non-conductive, and current path from external power supply line 902 to internal power supply 904 is cut off.

Meanwhile, when internal power supply voltage intVcc is lower than the reference voltage Vref, the voltage level of the output signal of comparing circuit 905b lowers, conductance of p channel MOS transistor 905c increases and current is supplied from external power line 902 to internal power line 904. The conductance of p channel MOS transistor 905c increases as the difference between internal power supply voltage intVcc and reference voltage Vref increases. Accordingly, as the internal power supply voltage intVcc lowers, current is increasingly supplied from external power supply line 902 to internal power supply 904, and the lowered internal power supply voltage intVcc returns to the prescribed voltage level at high speed.

Therefore, the internal power supply voltage intVcc on internal power supply line 904 is maintained approximately at the voltage level of reference voltage Vref. The reference voltage Vref is at a constant voltage level not dependent on the external power supply voltage extVcc when stress acceleration mode designating signal /STR is at an inactive state of H level and p channel MOS transistor 905d is non-conductive. More specifically, by the feedback loop of comparing circuit 905b and p channel MOS transistor 905c, the internal power supply voltage intVcc is also kept at a constant voltage level.

The operation mode in which the stress acceleration mode designating signal /STR is set to the active state of L level will be described. The stress acceleration mode designating signal is activated at the time of burn in test, for example. The burn in test is performed for reliability evaluation of semiconductor integrated circuit devices. Generally, failures of semiconductor devices are classified into three periods, that is, initial failure period, accidental failure period and wear-out failure period, as time goes. The initial failure refers to a failure generated immediately after the start of use of the devices, which reveals potential defects existing at the time of manufacturing the semiconductor devices. The rate of initial failure rapidly decreases, followed by the accidental failure period in which low failure rate lasts long for a prescribed period. Near the end of useful life of the semiconductor devices, wear out failure period starts, in which failure rate increases abruptly. It is desired that the semiconductor devices are used in the accidental failure period, which corresponds to the actually reliable life.

Therefore, in order to enhance reliability of semiconductor integrated circuit devices, low failure rate of accidental failure and long lasting accidental failure period are desired. Meanwhile, it is necessary to screen out defective products having causes of initial failure to eliminate initial failure in advance, by performing aging acceleration operation for a prescribed time period on the semiconductor devices to reveal defects possibly causing initial failure. In order to effectively perform screening in a short period of time, it is desirable that the initial failure rate of the semiconductor devices decrease rapidly by screening so that the accidental failure period starts early. At present, high temperature operation test (burn in test) as stress acceleration test is performed as one method of screening. In the burn in test, semiconductor devices are operated continuously for several tens of hours to several days in high temperature environment, so as to directly evaluate reliability of gate insulating films of MOS transistors and dielectric films of memory cell capacitors of semiconductor memory devices, using semiconductor devices which are to be shipped as products, and any cause of defects including migration (electro migration and stress migration) of aluminum interconnection is revealed by applying stresses of high temperature and high electric field (high temperature/high voltage operating condition). The test is more effective when degree of acceleration is increased by operating semiconductor devices while the temperature is being increased.

For the screening, referring to FIG. 21, the stress acceleration mode designating signal /STR is set to the active state at the time of stress acceleration test, so that p channel MOS transistor 905b is rendered conductive and reference voltage Vref is set to the level of external power supply voltage extVcc. In this state, because of comparing circuit 905 and p channel MOS transistor 905c, internal power supply voltage intVcc attains to the level of the external power supply voltage extVcc, and therefore the external power supply voltage extVcc can be applied to the memory circuit in the semiconductor integrated circuit device. By making higher the voltage level of the external power supply voltage extVcc, the voltage can be accelerated, enabling effective screening test.

FIG. 22 schematically shows the structure of memory circuit 908 shown in FIG. 20. Referring to FIG. 22, memory circuit 908 includes: a memory cell array 908a having a plurality of memory cells arranged in a matrix; a row decoder 908b for decoding an internal row address signal applied from an address buffer (not shown) for driving the addressed row of memory cell array 908a to the selected state; a column decoder 908c for decoding an internal column address signal from an address buffer, not shown, in the similar manner, for generating a column selection signal for designating a column of memory cell array 908a; and sense amplifiers 908d each provided corresponding to each column of memory cell array 90a for sensing and amplifying memory cell data read on the corresponding column when activated. In memory cell array 908a, a word line is arranged corresponding to each row, and memory cells of the corresponding row are connected to the word line. Row decoder 908b drives the word line arranged corresponding to the addressed row to the selected state. In memory cell array 908a, a bit line pair is arranged for each column of memory cells, and the memory cells of the corresponding column are connected to the bit line pair. Column decoder 908c generates a signal for selecting a bit line pair arranged corresponding to the addressed column. Sense amplifier 908d includes a sense amplifier circuit provided corresponding to each bit line pair for differentially amplifying the memory cell data read on the bit line pair.

The memory circuit further includes a peripheral control circuit 908e for generating internal control signals necessary for various internal operations in accordance with externally applied row address strobe signal /RAS, column address strobe signal /CAS and write enable signal /WE. Row address strobe signal /RAS indicates the start of a memory cycle, and in response to activation (L level) of row address strobe signal /RAS, row decoding operation starts. Column address strobe signal /CAS designates the start of a column selecting operation, and in accordance with activation (L level) of column address strobe signal /CAS, the address buffer, not shown, generates and applies to column decoder 908c an internal column address signal. Write enable signal /WE indicates data writing operation, and when column address strobe signal /CAS and write enable signal /WE both attain to the active state of L level, data writing to the selected memory cell is performed internally.

FIG. 23 schematically shows a structure of a portion related to one column of the memory cell array shown in FIG. 20. Referring to FIG. 23, a memory cell MC arranged corresponding to a crossing between a bit line BL and a word line WL is shown as a representative. One row of memory cells are connected to the word line WL, and one column of memory cells are connected to a bit line pair BL and /BL. Memory cell MC includes a capacitor MQ storing information, and an access transistor MT consisting of an n channel MOS transistor responsive to a signal potential on the word line WL for connecting the memory capacitor MQ to the bit line BL.

The sense amplifier circuit included in sense amplifier 908d includes p channel MOS transistors P1 and P2 having their gates and drains cross coupled, and n channel MOS transistors N1 and N2 having their gates and drains cross coupled. More specifically, p channel MOS transistor P1 has its drain connected to bit line BL, and its gate connected to the bit line /BL. The p channel MOS transistor P2 has its drain connected to bit line /BL, and its gate connected to bit line BL. The sources of p channel MOS transistors P1 and P2 are coupled to internal power supply line 904a through a p channel MOS transistor P3 which is rendered conductive in response to activation (L level) of sense amplifier activating signal φSP.

The n channel MOS transistor N1 has its drain connected to bit line BL, and its gate connected to bit line /BL.

The n channel MOS transistor N2 has its drain connected to the bit line /BL and its gate connected to the bit line BL. Sources of the n channel MOS transistors N1 and N2 are coupled to the ground line 907a through an n channel MOS transistor N3 which is rendered conductive when sense amplifier activating signal φSN is activated (H level).

For the bit lines BL and /BL, an n channel MOS transistor N4 for electrically short-circuiting bit lines BL and /BL in response to a bit line equalize designating signal φEQ, and n channel MOS transistors N5 and N6 which are rendered conductive in response to activation of the bit line equalize designating signal φEQ for transmitting a precharge voltage Vbl of a prescribed intermediate voltage level to bit lines BL and /BL are provided. The bit line equalize designating signal φEQ attains to the active state of H level when the semiconductor memory device as the semiconductor integrated circuit device (hereinafter simply referred to as a semiconductor memory device) is at a standby state (when row address strobe signal /RAS is at the inactive state of H level).

In an active cycle (when signal /RAS is at the L level), bit line equalize designating signal φEQ attains to the L level, and bit lines BL and /BL are set to the floating state at the voltage level of the prescribed precharge voltage Vb1. In this state, word line WL is selected and the stored data of memory cell MC is transmitted to bit line BL. Thereafter, sense amplifier activating signals φSP and φSN are activated, p channel MOS transistors P1 and P2 pull up one of the bit lines BL and /BL which is at a higher potential to the level of the internal power supply voltage intVcc on internal power supply line 904, while n channel MOS transistors N1 and N2 discharge the one of the bit lines BL and /BL which is at the lower potential, to the level of the ground voltage GND.

In this sensing operation, sensing operation of one row of memory cells connected to the selected word line WL of memory cell array 908a is performed. Therefore, a number of sense amplifier circuits operate simultaneously to charge/discharge respective bit line pairs. Therefore, much current is consumed during sensing operation of sense amplifiers 908d, and therefore it is a source of large current consumption as compared with other peripheral control circuit 908e, row decoder 908d and column decoder 908c.

In order to reduce power consumption of the semiconductor memory device, voltage level of internal power supply voltage intVcc generated from voltage down converter 905 is reduced. This makes smaller the voltage amplitude of the bit line pair, current consumption is reduced accordingly, and therefore power consumption can be reduced. However, voltage down converter 905 generates only one internal power supply voltage intVcc on internal power supply line 904. Accordingly, this low internal power supply voltage intVcc is also transmitted to the peripheral control circuit 908e, row decoder 908b and column decoder 908c as the peripheral circuitry. The MOS transistor has its speed of operation defined by the gate voltage (the drain current of MOS transistor is given as a square function of the gate voltage (when it operates in a saturation region)). Therefore, in this case, a semiconductor memory device operating at a high speed cannot be realized.

It may be possible to set higher the voltage level of internal power supply voltage intVcc and apply it to row decoder 908b, column decoder 908c, peripheral control circuit 908e and so on in order to realize high speed operation. However, in that case also, the internal power supply voltage intVcc which is made higher is applied to the sense amplifier 908d provided corresponding to each column of the memory cell array, voltage amplitude of each bit line increases, and therefore current consumption cannot be reduced.

Therefore, in the conventional semiconductor memory device, as it is provided with a voltage down converter generating only one internal power supply voltage, it has been difficult to realize high speed operation and low power consumption simultaneously.

SUMMARY OF THE INVENTION

An object of the present invention is to provide a semiconductor integrated circuit device which enables both high speed operation and low power consumption.

Another object of the present invention is to provide a semiconductor integrated circuit device which allows effective reliability evaluation test while realizing both high speed operation and low power consumption.

The semiconductor integrated circuit device of the present invention includes: a first reference voltage generating circuit coupled to a first power supply node and supplied with current from the first power supply node for generating a first reference voltage; a second reference voltage generating circuit coupled to a second power supply node and supplied with a current from the second power supply node for generating a second reference voltage of a level different from the first reference voltage; a first comparing circuit which operates using the voltage of the first power supply node as one operational power supply voltage, for comparing a voltage of an output node of the first reference voltage generating circuit with a voltage on a first internal power supply line; a first current drive element coupled between the first power supply node and a second internal power supply line for supplying current from the first power supply node to the first internal power supply line in accordance with an output signal from the first comparing circuit; a first switching element coupled between the first power supply node and the output node of the first reference voltage generating circuit, responsive to activation of the stress acceleration mode designating signal for electrically coupling the output node of the first reference voltage generating circuit to the first power supply node; a second comparing circuit for comparing the voltage of an output node of the second reference voltage generating circuit with a voltage of a second internal power supply line provided separate from the first internal power supply line; a second current drive element coupled between the second power supply node and the second internal power supply line for supplying current from the second power supply node to the second internal power supply line in accordance with an output signal of the second comparing circuit; and a second switching element coupled with the second power supply node and an output node of the second reference voltage generating circuit, responsive to activation of the stress acceleration mode designating signal for electrically coupling the second power supply node and the other node of the second reference voltage generating circuit.

Since internal power supply voltages are generated in accordance with a plurality of reference voltages having different voltage levels, it becomes possible to apply optimal internal power supply voltages to circuit portions in which low power consumption is given priority and circuit portion in which high speed operation is required, respectively, in the semiconductor integrated circuit device, and hence a semiconductor integrated circuit device which can operate at high speed while consuming less current can be realized.

Further, as the reference voltage output node is coupled to the external power supply voltage supplying node at the time of stress acceleration mode, the reference voltage can be externally adjusted, and the voltage down converter can be operated in accordance with the external power supply voltage. Therefore, the circuit generating the internal power supply voltage, that is, the voltage down converter can be subjected to stress acceleration test, and hence reliability evaluation of the semiconductor integrated circuit device can surely be performed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
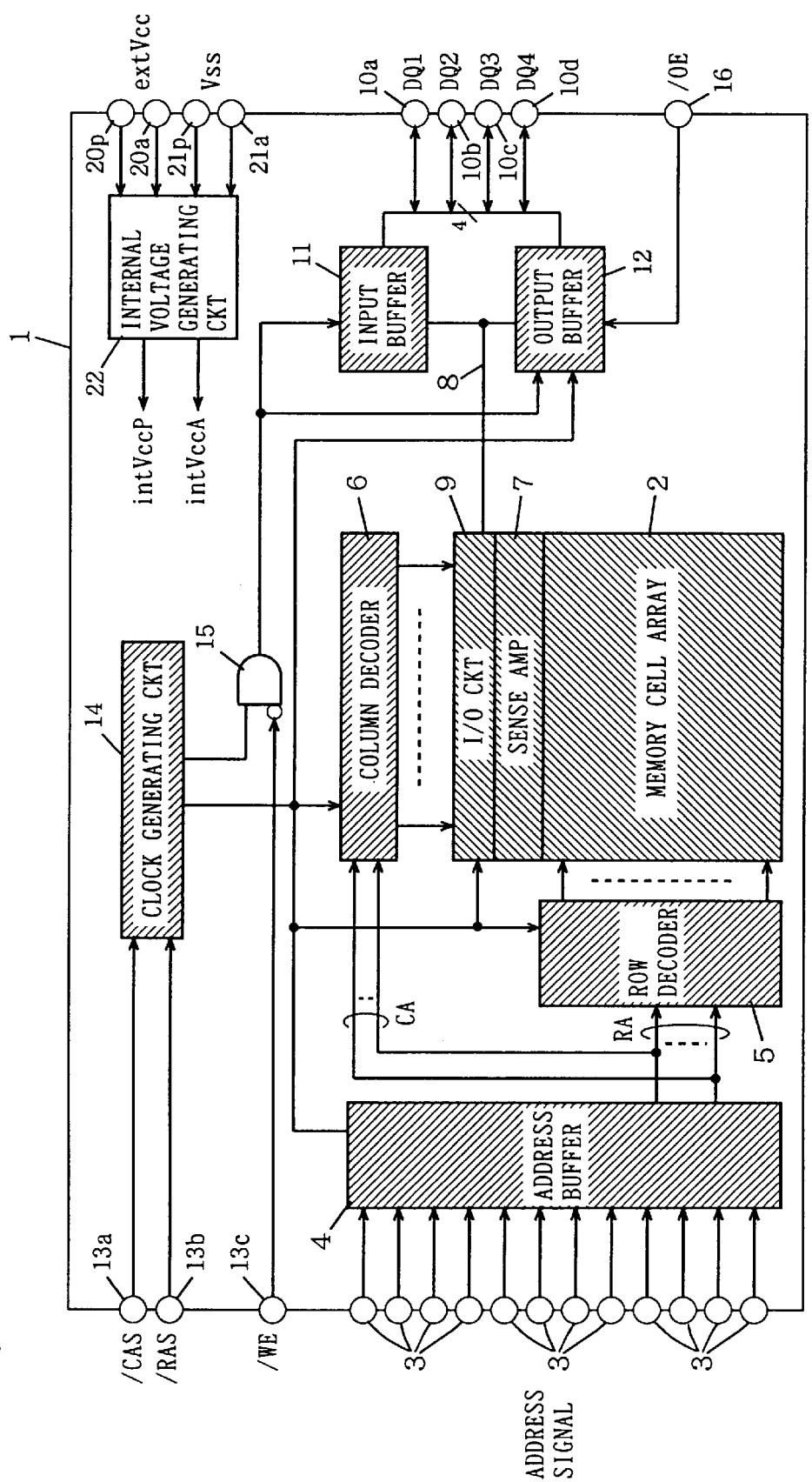
FIG. 1 schematically shows the overall structure of the semiconductor integrated circuit device in accordance with a first embodiment of the present invention.

FIG. 1 schematically shows the overall structure of the semiconductor memory device in accordance with the first embodiment of the present invention. Referring to FIG. 1, the semiconductor memory device 1 includes: a memory cell array 2 having a plurality of memory cells arranged in a matrix; an address buffer 4 receiving an address signal applied to an address input terminal 3 for generating an internal row address signal RA and an internal column address signal CA; a row decoder 5 for decoding the internal row address signal RA applied from address buffer 4 for driving an addressed row of memory cell array 2 to a selected state; a column decoder 6 for decoding the internal address signal CA applied from address buffer 4 for generating a column selection signal for selecting an addressed column of memory cell array 2; a sense amplifier 7 provided corresponding to each column of memory cell array 2 for sensing, amplifying and latching data of memory cells of the corresponding column when activated; and an input/output circuit 9 for inputting/outputting data between the selected memory cell of memory cell array 2 and an internal data bus 8. In the memory cell array 2, similar to the structure shown in FIG. 23 described above, word lines are arranged corresponding to respective rows, and corresponding row of memory cells are connected to each word line. A bit line pair is provided for each column of memory cell array 2, and corresponding column of memory cells are connected to each bit line pair.

Row decoder 5 drives a word line which corresponds to the addressed row to the selected state. Between the row decoder 5 and the word line to be driven to the selected state, there is provided a word line drive circuit for transmitting a boosted voltage higher than the internal power supply voltage, which will be described later. Column decoder 6 generates a column selection signal for selecting a bit line pair which is provided corresponding to the addressed column of memory cell array 2.

Figure 23:
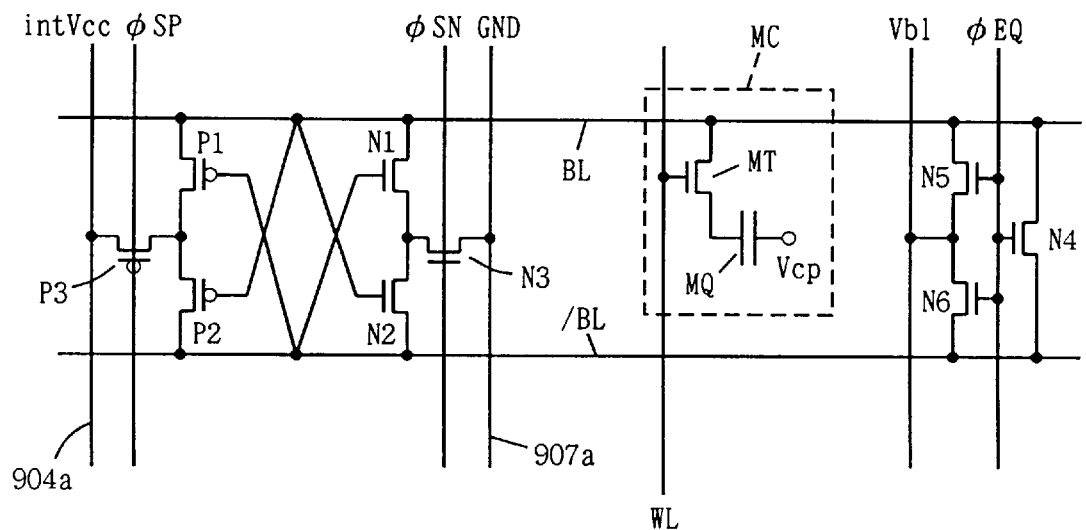
FIG. 23 schematically shows the structure of the memory array portion shown in FIG. 22.

Sense amplifier 7 includes a pair of cross coupled p channel MOS transistors and a pair of cross coupled n channel MOS transistors, as in the structure shown in FIG. 23.

Input/output circuit 9 includes a preamplifier for amplifying data of a selected memory cell of memory cell array 2 for transmission to internal data input/output bus 8 at the time of data reading, and a write driver activated at the time of data writing for amplifying data transmitted to internal data bus 8 for transmission to a selected memory cell.

Semiconductor memory device 1 further includes: an input buffer 11 for receiving and amplifying external write data DQ1 to DQ4 applied to data input/output terminals 10a to 10d for transmission to internal data bus 8; an output buffer 12 for amplifying internal read data transmitted to internal data bus 8 for outputting to external data input/output terminals 10a to 10d in the data reading operation mode; a clock generating circuit 14 for generating internal control signals necessary for various operations in accordance with the column address strobe signal /CAS applied to a control signal input terminal 13a and the row address strobe signal /RAS applied to a control signal input terminal 13b; and a gate circuit 15 receiving the internal control signals from clock generating circuit 14 and the write enable signal /WE applied to a control signal input terminal 13c for generating a write/read control signal.

Clock generating circuit 14 generates an internal control signal for determining an address taking timing of the address buffer, timing of decoding of row decoder 5, timing of decoding of column decoder 6 and activation/inactivation of output buffer 12, as well as an internal control signal for defining timing of activation of sense amplifier 7 and timing of activation of input/output circuit 9.

Gate circuit 15 receives, at its one input, a signal which attains to the H level when column address strobe signal /CAS and row address strobe signal /RAS are both active, from clock generating circuit 14. When write enable signal /W is set to the active state of L level, gate circuit 15 activates input buffer 11 and stops internal data reading operation of output buffer 12. Output buffer 12 is set to an operative state when write enable signal /WE is inactive indicating read operation mode. Further, output buffer 12 receives output enable signal /OE through a terminal 16. Output enable signal /OE determines output impedance of output buffer 12. Output buffer 12 attains to an output low impedance state when column address strobe signal /CAS and output enable signal /OE are both at the active state of L level, amplifies data applied to internal data bus 8 and outputs read data DQ1 to DQ4 to data input/output terminals 10a to 10d. When row address strobe signal /RAS and column address strobe signal /CAS are both at the L level, and the output enable signal /OE is set to the active state of L level, it is set to the output low impedance state, and performs data output operation. Once set to the low impedance state, the output buffer 12 is kept at the low impedance state until the output enable signal /OE or the column address strobe signal /CAS next attains to the inactive state of H level.

Gate circuit 15 further has a function of setting output buffer 12 to output high impedance state even when output enable signal /OE is active, in data writing operation.

The semiconductor memory device 1 further includes an internal power supply voltage generating circuit 22 which operates receiving an external power supply voltage extVcc applied to power supply terminals 20a and 20p and a ground voltage Vss applied to external ground terminals 21a and 21p for generating internal power supply voltages intVccP and intVccA having mutually different voltage levels. Internal power supply voltage intVccA is applied to memory cell array 2, sense amplifier 7 and input/output circuit 9. Internal power supply voltage intVccP is applied to the peripheral circuitry such as address buffer 4, row decoder 5, column decoder 6, input buffer 11, output buffer 12, clock generating circuit 14 and gate circuit 15. The power supply voltage intVccA for the array has its voltage level lowered to realize low power consumption, while internal power supply voltage intVccP for the peripheral circuitry has its voltage level made higher for realizing high speed operation.

The internal power supply voltage intVccA is applied to memory cell array 2 in order to apply a bias voltage to an N well in which a p channel MOS transistor is formed in a sense amplifier forming region. From the array internal power supply voltage intVccA, a cell plate voltage Vcp to be applied to the memory cell capacitor and the bit line precharge voltage Vb1 are generated and applied to the memory array. Sense amplifier 7 operates using the array internal power supply voltage intVccA as one operational power supply voltage.

Figure 2:
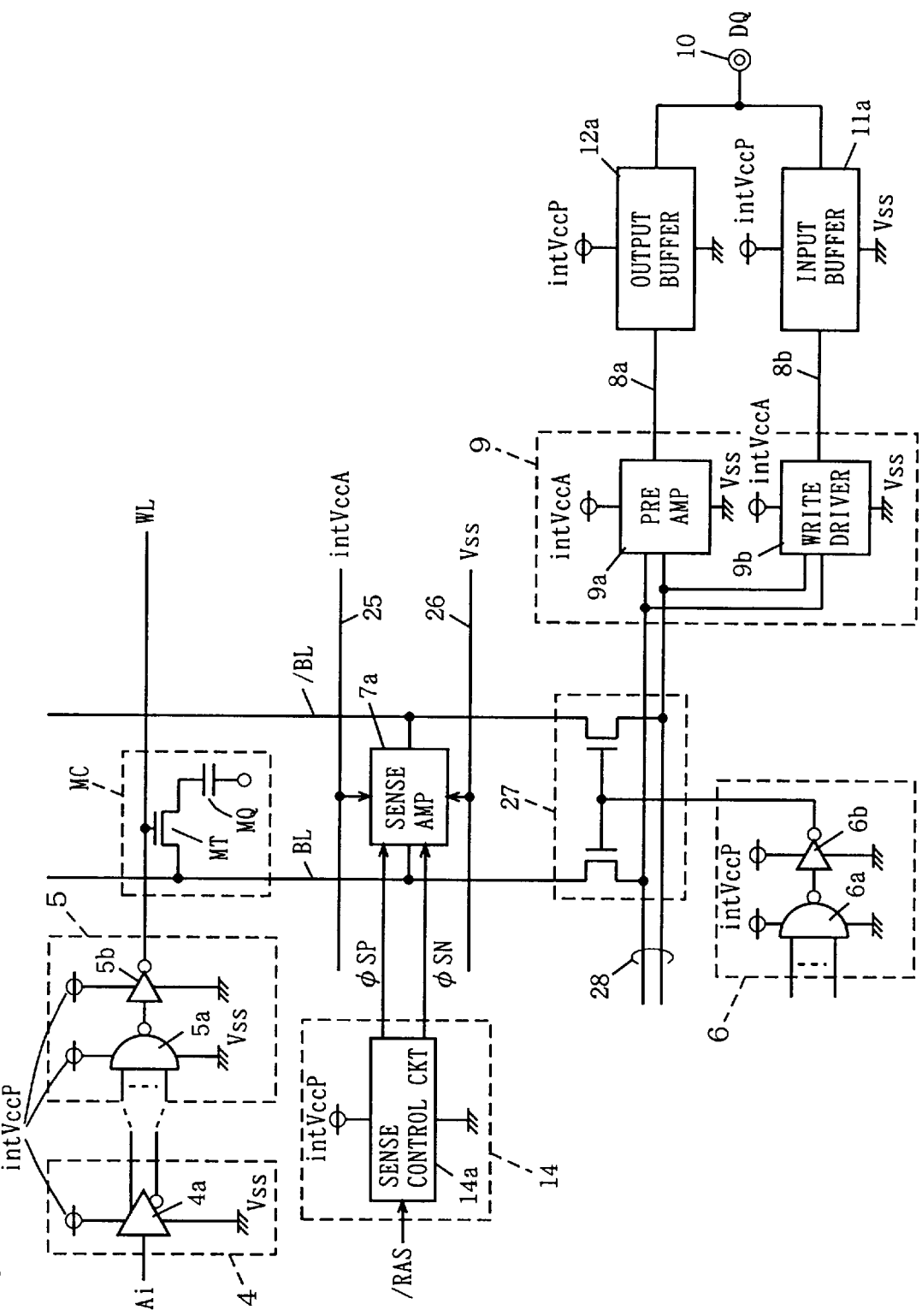
FIG. 2 schematically shows a structure of a main portion of the semiconductor integrated circuit device shown in FIG. 1.

FIG. 2 schematically shows the structure of a portion related to one bit of memory cell of the semiconductor memory device shown in FIG. 2. Referring to FIG. 2, address buffer 4 includes a buffer circuit 4a which operates using peripheral power supply voltage intVccP and the ground voltage Vss as operational power supply voltages, and receives an externally applied address signal bit Ai for generating complementary internal address signal bits Ai and /Ai. The complementary address signal bits from address buffer 4a are applied to row decoder 5 and column decoder 6. Column decoder 5 includes an NAND circuit 5a which operates using the peripheral internal power supply voltage intVccp as one operational power supply voltage and receives the address signal bits of a prescribed combination applied from address buffer 4, and an inverter circuit 5b which operates using the peripheral internal power supply voltage intVccP as one operational power supply voltage, inverts an output signal of NAND circuit 5a for transmission to word line WL. Between row decoder 5 and word line WL, there is provided a word line drive circuit for transmitting a word line driving signal generated from a circuit not shown, to word line WL in accordance with an output signal from inverter circuit 5b. The word line driving signal is at the level of a boosted voltage Vpp which is generated based on the array internal power supply voltage intVccA.

At a crossing between the word line WL and the bit line BL, a memory cell MC is arranged. The memory cell MC includes a memory capacitor MQ storing information, and an access transistor MT responsive to the potential on word line WL for connecting capacitor MQ to bit line BL. To a cell plate electrode of memory cell capacitor MQ, an intermediate voltage at one half the level of the array internal power supply voltage intVccA is applied.

A sense amplifier circuit 7a is provided for the bit lines BL and /BL. Sense amplifier circuit 7a is included in sense amplifier 7 shown in FIG. 1. Sense amplifier circuit 7a is activated in response to sense amplifier activating signals φSP and φSN, operates using the array internal power supply voltage intVccA and the ground voltage Vss respectively applied to internal power supply line 25 and the ground line 26 as both operational power supply voltages, and differentially amplifies potentials of bit lines BL and /BL. Though not shown in FIG. 2, there is provided a bit line equalize circuit for equalizing potentials of bit lines BL and /BL at a prescribed intermediate voltage level (½ of the array internal power supply voltage intVccA).

Sense amplifier activating signals φSP and φSN are output from a sense control circuit 14a included in clock generating circuit 14. Sense control circuit 14a operates using peripheral internal power supply voltage intVccP as one operational power supply voltage, and outputs sense amplifier activating signals φSP and φSN at a prescribed timing in accordance with the row address strobe signal /RAS. The sense control circuit 14a may include a level converter for converting sense amplifier activating signals φSP and φSN to the power supply voltage level of the array internal power supply voltage intVccA.

Column decoder 6 includes an NAND circuit 6a which operates using peripheral internal power supply voltage intVccP as one operational power supply voltage and receives a prescribed combination of internal column address signal bits from address buffer 4, and an inverter circuit 6b which operates using the internal power supply voltage intVccP as one operational power supply voltage and inverts an output signal from NAND circuit 6a. An output signal from inverter circuit 6b is applied to column selection gate 27 provided for bit lines BL and /BL. Column selection gate 27 is rendered conductive when the output signal (column selection signal) of inverter circuit 6b is at the H level, and connects bit lines BL and /BL to internal data line pair 28. In the column decoder 6 also, inverter circuit 6b may include a level converting circuit for generating a column selection signal at a voltage level of the array internal power supply voltage intVccA.

Input/output circuit 9 includes a preamplifier 9a which operates using array internal power supply voltage intVccA as one operational power supply voltage and amplifies data on internal data line pair 28, and a write driver 9a which operates using the array internal power supply voltage intVccA as one operational power supply voltage and transmitting complementary write data to internal data line pair 28.

An output signal from preamplifier 9a is applied to output buffer circuit 12a through an internal read line 8a. Write driver 9b receives internal write data from input buffer circuit 11a through internal write data line 8b. Output buffer circuit 12a and input buffer circuit 11a operate using the peripheral power supply voltage intVccP as one operational power supply voltage. Output buffer circuit 12a may operate, at the last stage coupled to the external terminal 10, in accordance with external power supply voltage extVcc. Input buffer circuit 11a may be adapted such that an input first stage coupled to the data input/output terminal 10 operates in accordance with the external power supply voltage extVcc.

As shown in FIGS. 1 and 2, one operational power supply voltage of the peripheral circuitry is the peripheral internal power supply voltage intVccP, and the power supply voltage applied to the inside of the array is the internal power supply voltage intVccA which is lower. The voltages of bit lines BL and /BL change between the array internal power supply voltage intVccA and the ground voltage Vss, the voltage amplitude is small and charging/discharging current becomes smaller, and accordingly, current consumption is reduced.

Meanwhile, the power supply voltage intVccP for the peripheral circuitry is set to a voltage level higher than the array internal power supply voltage intVccA. Therefore, gate voltage level of MOS transistors constituting various circuits in the peripheral circuitry increases, various internal nodes can be charged/discharged at high speed, and therefore high speed operation is realized.

Figure 3:
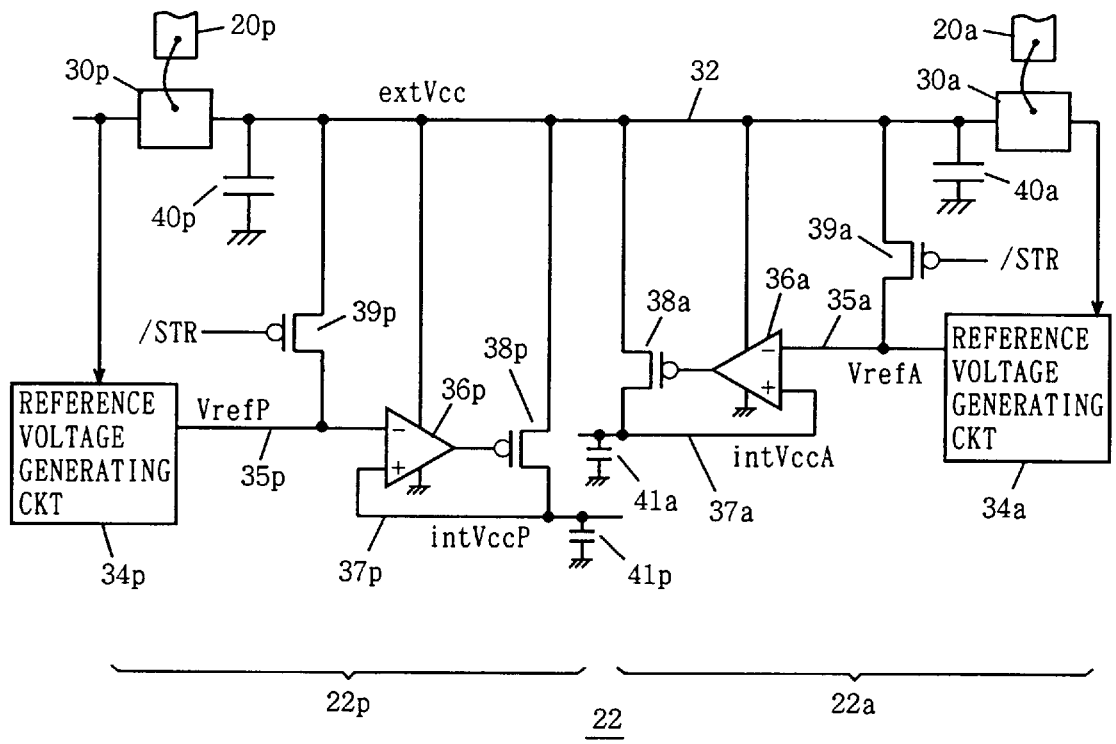
FIG. 3 shows a structure of an internal power supply voltage generating circuit shown in FIG. 1.

FIG. 3 schematically shows the structure of the internal power supply voltage generating circuit 22 shown in FIG. 1. Referring to FIG. 3, internal power supply voltage generating circuit 22 includes a peripheral voltage down converter 22p generating the peripheral internal power supply voltage intVccP from an external power supply voltage extVcc on a power supply pad 30p connected to an external power supply terminal 20p and from reference voltage VrefP, and an array voltage down converter 22a for generating the array internal power supply voltage intVccA in accordance with an external power supply voltage extVcc on a pad 30a connected to an external power supply terminal 20a and from reference voltage VrefA.

Peripheral voltage down converter 22p includes a reference voltage generating circuit 34p supplied with current from external power supply voltage intVcc on power supply pad 30p and generating a reference voltage VrefP having very small dependency on external power supply voltage extVcc, a comparing circuit 36p consisting of a differential amplifier differentially amplifying the reference voltage VrefP on output node 35p of reference voltage generating circuit 34p and internal power supply voltage intVccP on peripheral internal power supply line 37p, and a p channel MOS transistor 38p coupled between external power supply node 30p and internal power supply line 37p for supplying current from external power supply line 32 connected to the power supply pad to internal power supply 37p in accordance with an output signal from comparing circuit 36p. External power supply line 32 interconnects external power supply pads 30p and 30a.

Peripheral voltage down converter 22p further includes a p channel MOS transistor 39p which is rendered conductive when stress acceleration mode designating signal /STR is activated for electrically connecting external power supply line 32 with an output node of reference voltage generating circuit 34p. A stabilizing capacitor 40p is provided for external power supply line 32, in adjacency to pad 30p.

Array voltage down converter 22a includes a reference voltage generating circuit 20a receiving the external power supply voltage extVcc from power supply pad 30a for generating a reference voltage VrefA having very small dependency on external power supply voltage extVcc, a comparing circuit 36a consisting of a differential amplifier differentially amplifying the internal power supply voltage intVccA on internal power supply line 37a and the reference voltage Vref, and a p channel MOS transistor 38a coupled between external power supply line 32 and internal power supply line 37a for supplying current from external power supply line 32 to internal power supply line 37a in accordance with an output signal from comparing circuit 36a. Comparing circuit 36a operates using external power supply voltage extVcc on external power supply line 32 as one operational power supply voltage. The same applies to comparing circuit 36p.

The array voltage down converter 22a further includes a p channel MOS transistor 39a which is rendered conductive when stress acceleration mode designating signal /STR is active for electrically connecting external power supply line 32 to output node 35a of reference voltage generating circuit 34a. Adjacent to power supply pad 30a, stabilizing capacitor 40a for external power supply line 32 is provided.

Internal power supply lines 37p and 37a are provided separately, and supply operational power supply voltages to peripheral circuitry and array circuitry, respectively.

The peripheral reference voltage VrefP is at a voltage level higher than the array reference voltage VrefA. When MOS transistor 39p is non-conductive (in a mode other than stress acceleration mode), by comparing circuit 36p and p channel MOS transistor 38p, the peripheral internal power supply voltage intVccP on internal power supply line 37p is maintained at the voltage level of reference voltage VrefP. Similarly, when MOS transistor 39a is non-conductive, the array internal power supply voltage intVccA on internal power supply line 37a is kept at the voltage level of the reference voltage VrefA generated from reference voltage generating circuit 34a, because of the feedback loop of comparing circuit 36a and p channel MOS transistor 38a.

In the stress acceleration mode such as the burn in mode, the stress acceleration mode designating signal /STR attains to the active state of L level, MOS transistors 39a and 39p are rendered conductive and reference voltages VrefP and VreA attain to the voltage level of the external power supply voltage extVcc on external power supply line 32. In this state, comparing circuits 36p and 36a differentially amplify external power supply voltage extVcc and internal power supply voltage intVccP and intVccA. Therefore, internal power supply voltages intVccP and intVccA change in accordance with external power supply voltage extVcc. Internal power supply line 37p applies one operational power supply voltage to the peripheral circuitry, and internal power supply line 37a supplies one operational power supply voltage to the sense amplifiers and input/output circuit. It is possible to accelerate voltage stress by changing the operational power supply voltages to respective circuits, in accordance with the external power supply voltage extVcc.

By connecting output nodes 35p and 35a of reference voltage generating circuits 34p and 34a to external power supply line 32, respectively, it is possible to accelerate stress to comparing circuits (36p, 36a, 38p, 38a) of these voltage down converters, as the voltage stress is accelerated to respective components of comparing circuits 36p and 36a and hence reliability evaluation can surely be performed on the voltage down converters.

Figure 4:
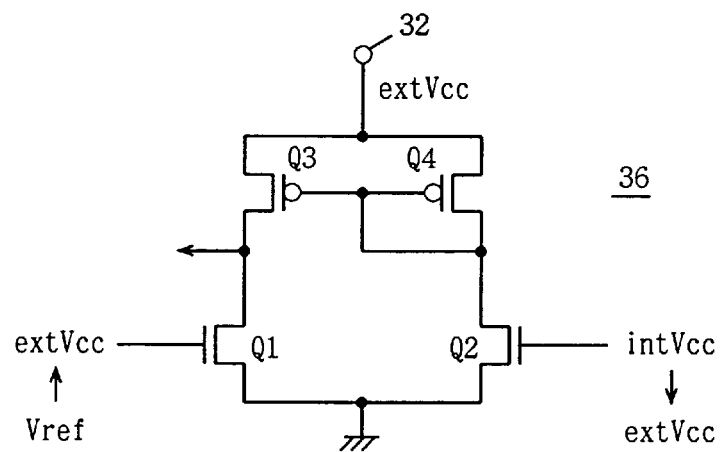
FIG. 4 schematically shows an example of the structure of the comparing circuit shown in FIG. 3.

FIG. 4 shows an example of the structure of comparing circuits 36p and 36a shown in FIG. 3. Referring to FIG. 4, comparing circuit 36 (36p, 36a) includes n channel MOS transistors Q1 and Q2 for comparing reference voltage Vref with internal power supply voltage intVcc, and p channel MOS transistors Q3 and Q4 providing a current mirror stage for supplying current to MOS transistors Q1 and Q2 from external power supply line 32. A connection node of MOS transistors Q1 and Q3 is connected to the gate of p channel MOS transistor 38 for driving current. In the stress acceleration mode, reference voltage Vref is set to the voltage level of external power supply voltage extVcc. In this state, internal power supply voltage intVcc changes to the level of external power supply voltage extVcc. Therefore, in the comparing circuit 36, external power supply voltage extVcc is applied to the gates of MOS transistors Q1 and Q2, the internal node changes to the level of the external power supply voltage extVcc accordingly, and voltage stress to each of the transistors of comparing circuit 36 can be accelerated, enabling reliability evaluation of the comparing circuit.

Reference voltage generating circuits 34p and 34a are coupled to external power supply pads 30p and 30a, respectively, and therefore applied voltage stress is accelerated also for the reference voltage generating circuits 34p and 34a. Therefore, voltage stress of voltage down converters 22p and 22a can also be accelerated. Accordingly, reliability evaluation of voltage down converters becomes possible.

Figure 5:
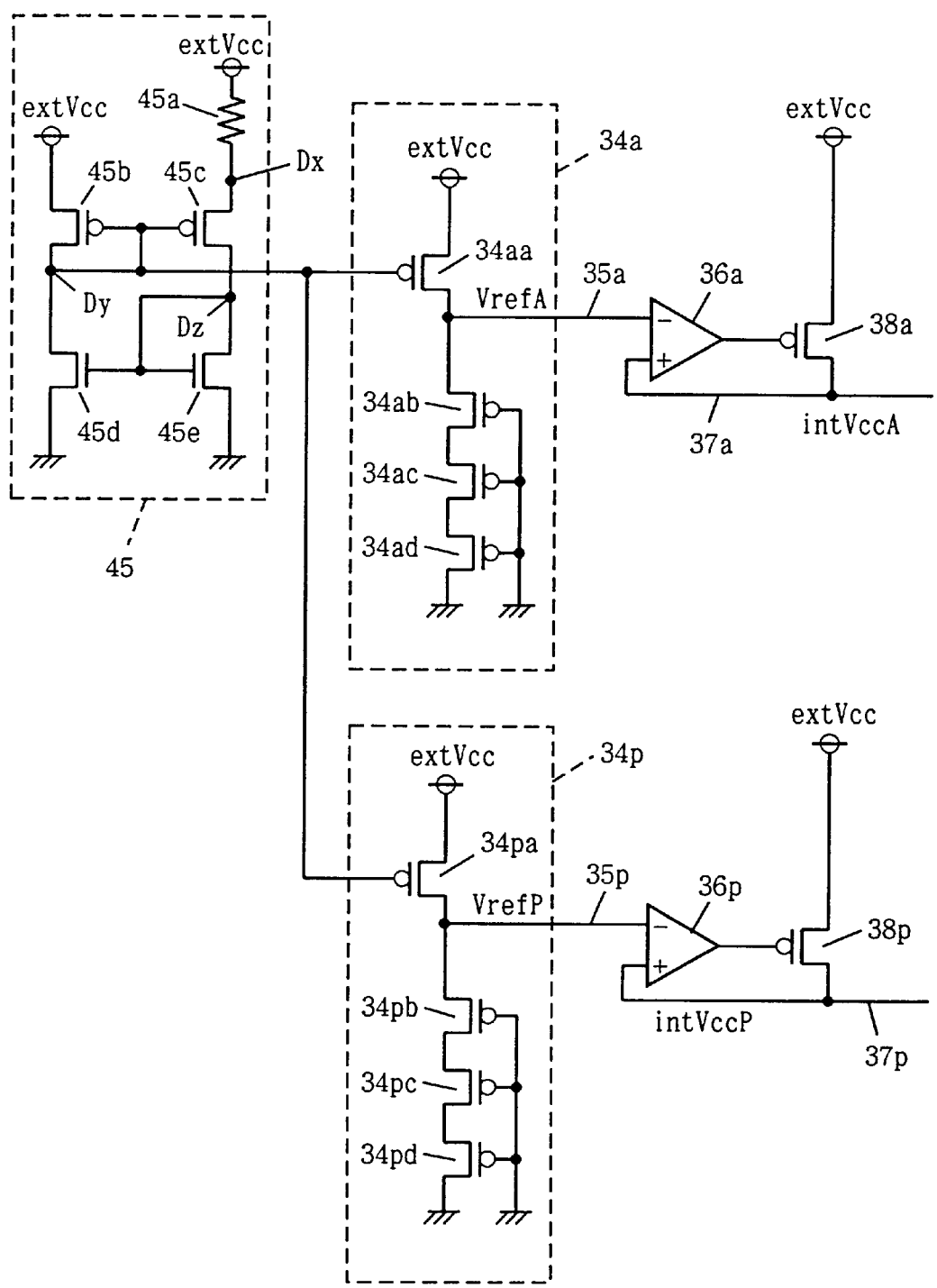
FIG. 5 shows an example of the structure of the reference voltage generating circuit shown in FIG. 3.

FIG. 5 shows an example of a specific structure of reference voltage generating circuits 34a and 34p shown in FIG. 3. Referring to FIG. 5, a constant current source 45 which operates using external power supply voltage extVcc as one operational power supply voltage and generates a current not dependent on the external power supply voltage extVcc is provided common to the reference voltage generating circuits 34a and 34p.

Constant current source 45 includes: a resistance element 45a connected between an external power supply node and an internal node Dx; a p channel MOS transistor 45b connected between an external power supply node and an internal node Dy and having its gate connected to the internal node Dy; a p channel MOS transistor 45c connected between internal node Dx and an internal node Dz and having its gate connected to internal node Dy; an n channel MOS transistor 45d connected between internal node Dy and a ground node and having its gate connected to internal node Dz; and an n channel MOS transistor 45e connected between internal node Dz and ground node and having its gate connected to internal node Dz. Transmission coefficient β of MOS transistor 45c is higher than that of MOS transistors 45b, 45d and 45e, and it is set to the magnitude ten times larger, for example.

MOS transistors 45b and 45c constitute a current mirror circuit, and MOS transistors 45e and 45d constitute a current mirror circuit. A current same in magnitude as the current supplied from MOS transistor 45c to MOS transistor 45e flows through MOS transistor 45d. To MOS transistor 45d, current is supplied from MOS transistor 45b. Therefore, current of the same magnitude flows through MOS transistors 45c and 45b. Transmission coefficient β of MOS transistor 45c is made sufficiently higher than MOS transistor 45b. Therefore, gate-source voltage of MOS transistor 45b becomes larger than the source-gate voltage of MOS transistor 45c. Because of the difference in transmission coefficient β of MOS transistors 45b and 45c, the voltage level at internal node Dx attains to a little lower than the external power supply voltage extVcc. The voltage difference between external power supply node extVcc (here, a node and a voltage on the node are denoted by the same symbol) and internal node Dx is converted to a current by resistance element 45a. Therefore, the voltage of internal node Dx is determined by the difference in transmission coefficient β between MOS transistors 45b and 45c. Therefore, current value flowing through resistance element 45a is a value determined by the transmission coefficients of MOS transistors 45b and 45c as well as the resistance value of resistance element 45a, that is, a value not dependent on external power supply voltage extVcc.

Reference voltage generating circuit 34a includes a p channel MOS transistor 34aa connected between external power supply node extVcc and output node 35a and having its gate connected to internal node Dy, and p channel MOS transistors 34ab, 34ac, 34ad connected in series between output node 35a and the ground node and having respective gates connected to ground node.

The p channel MOS transistor 34aa constitutes a current mirror circuit together with p channel MOS transistor 45b of constant current source 45, and therefore, a mirror current of the current flowing through MOS transistor 45b flows through MOS transistor 34aa. MOS transistors 34ab, 34ac, and 34ad have their gates connected to the ground node, and each of the MOS transistors 34ab to 34ad operates as a resistance element, because of the channel resistance thereof. In order to sufficiently reduce current consumption, resistance values of MOS transistors 34ab to 34ad are made sufficiently high. From the channel resistances of MOS transistors 34ab to 34ad and the current applied from MOS transistor 34aa, the reference voltage VrefA is generated. The current flowing through MOS transistor 34aa is a constant current not dependent on external power supply voltage extVcc. Therefore, reference voltage VrefA has a constant voltage level not dependent on external power supply voltage extVcc (when the external power supply voltage extVcc is at least a prescribed voltage level).

The reference voltage VrefA is applied to comparing circuit 36a, and under the control of comparing circuit 36a, p channel MOS transistor 38a supplies current from the external power supply node to internal power supply line 37a. Therefore, the internal power supply voltage intVccA comes to have a voltage level of the reference voltage VrefA (in operation modes other than the stress acceleration mode).

Reference voltage generating circuit 34p includes a p channel MOS transistor 34pa connected between external power supply node and output node 35p and having its gate connected to internal node Dy of constant current source 45, and p channel MOS transistors 34pb, 34pc and 34pd connected in series to each other between output node 35p and the ground node and having their gates connected to the ground node. Each of MOS transistors 34pb to 34pd operate in a resistance mode, and in accordance with the channel resistance, converts the current supplied from MOS transistor 34pa to a voltage. MOS transistor 34pa constitute a current mirror circuit together with the MOS transistor 45b of constant current source 45. Therefore, in the reference voltage generating circuit 34p, the reference voltage VrefP from output node 35p has a voltage level determined by a product of constant current supplied from constant current source 45 and the channel resistances of MOS transistors 34pb to 34pd, and therefore it has a constant voltage level not dependent on the external power supply voltage extVcc. Comparing circuit 36p compares the internal power supply voltage intVccP and the reference voltage VrefP, and in accordance with the result of comparison, adjusts conductance of p channel MOS transistors 38p.

By adjusting channel resistance of MOS transistors 34ab to 34ad and channel resistance of MOS transistors 34pb to 34pd, it is possible to make voltage levels of reference voltages VrefA and VrefP different from each other. The difference in channel resistance can be realized by impurity implantation to channel region of each MOS transistor, for example. Alternatively, by simply providing different numbers of MOS transistors (34ab to 34ad and 34pb to 34pd) operating in the resistance modes, the levels of reference voltages VrefA and VrefP can be readily adjusted.

Though not shown in FIG. 5, an MOS transistor for transmitting the external power supply voltage at the time of stress acceleration mode is provided for each of output nodes 35a and 35p. MOS transistors 34ab to 34ad and 34pb to 34pd have their impedances made sufficiently large and current drivability made sufficiently small to reduce current consumption. Therefore, when the channel width of MOS transistors 39a and 39p shown in FIG. 3 is set to about several tens of μm, for example, it is possible to set output nodes 35a and 35p to the level of external power supply voltage extVcc even when the reference voltage generating circuit 34a and 34p are in operation.

Modification of the Voltage Down Converter

Figure 6:
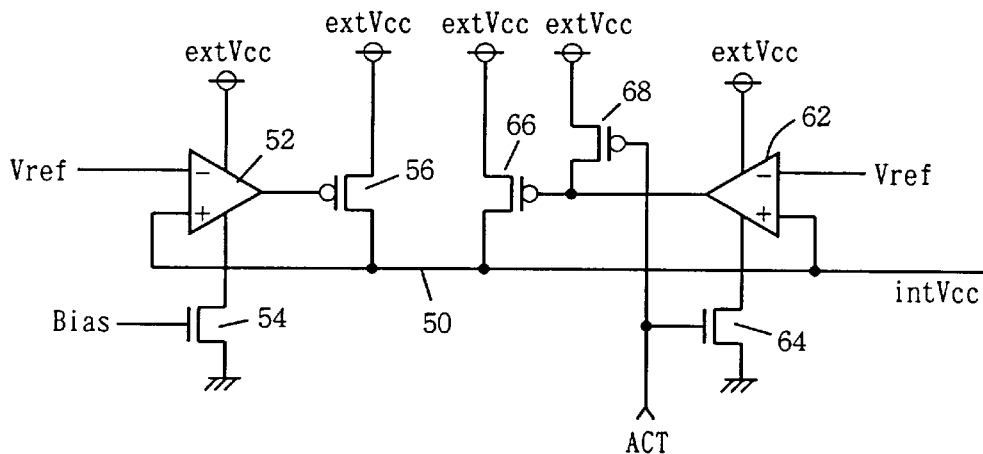
FIG. 6 schematically shows a structure of the internal power supply voltage generating circuit in accordance with a modification of the first embodiment of the present invention.

FIG. 6 shows a structure of a modification of the voltage down converter. Since peripheral voltage down converter has the same circuit structure as the array voltage down converter (with different reference voltage level), structure of only one voltage down converter is shown in FIG. 6.

Referring to FIG. 6, the voltage down converter includes a comparing circuit 52 comparing the internal power supply voltage intVcc on internal power supply line 50 and the reference voltage Vref, a current source transistor 54 receiving a bias voltage Bias of a constant voltage level at its gate and functioning as a current source for comparing circuit 52, and a p channel MOS transistor 56 of which conductance is adjusted in accordance with an output signal from comparing circuit 52 and supplying current from the external power supply node to internal power supply line 52.

Comparing circuit 52, current source transistor 54 and MOS transistor 56 operate constantly, supply current from the external power supply node to internal power supply line 50 in accordance with the difference between reference voltage Vref and internal power supply voltage intVcc, and maintain the voltage level of internal power supply voltage intVcc constant. The circuit portion operating constantly has the current drivability made small to reduce current consumption (current supplying capability of MOS transistor 54 is made small).

The voltage further includes a comparing circuit 62 comparing reference voltage Vref and internal power supply voltage intVcc when activated, a current source transistor 64 which is rendered conductive when activation signal ACT is activated, and forms a current path between the external power supply node of comparing circuit 62 and the ground node, a p channel MOS transistor 66 having its conductance adjusted in accordance with an output signal from comparing circuit 62 and supplying current from external power supply node to internal power supply node 50, and a p channel MOS transistor 68 for setting the output node of comparing circuit 62 at the level of external power supply voltage extVcc when activation signal ACT is inactive.

Activation signal ACT is generated, for example, in synchronization with row address strobe signal /RAS, and when the semiconductor memory device is in the standby state, the activation signal ACT attains to the inactive state of L level, and in an active cycle in which memory cell selecting operation is performed, the activation signal ACT is set to the active state of H level. Therefore, when activation signal ACT is inactive, MOS transistor 64 is rendered non-conductive, current path (path from external power supply node to the ground node) of comparing circuit 62 is cut off, comparing circuit 62 is inactivated, and MOS transistor 68 is rendered conductive and sets the output node of comparing circuit 62 to the level of the external power supply voltage extVcc. Accordingly, MOS transistor 66 is kept non-conductive.

More specifically, the voltage down converter portion of comparing circuit 62 and MOS transistor 66 are rendered inactive in the standby cycle, so that current consumption is reduced. Meanwhile, in the active cycle, activation signal ACT attains to the H level, comparing circuit 62 is activated as current path from the external power supply node to the ground node is formed accordingly, and compares reference voltage Vref and internal power supply voltage intVcc, and in accordance with the result of comparison, conductance of MOS transistor 66 is adjusted. MOS transistor 68 is non-conductive in the active cycle. Comparing circuit 62 and MOS transistor 66 are adapted to have high current drivability, and in the active cycle, these compensate for the variation of internal power supply voltage intVcc at the time of operation of internal circuitry at high speed.

In the array voltage down converter, much current is consumed during operation of sense amplifier (current is not much consumed in the latch state after the completion of sensing operation), and therefore the activation signal ACT may be activated in response to the sense amplifier activating signal at the time of sensing operation of the sense amplifier, and it may be kept inactive after the end of sensing operation.

In the peripheral voltage down converter, for the circuits operating when row address strobe signal /RAS is active, the activation signal ACT may be changed in accordance with the row address strobe signal /RAS, and for the circuit related to column selection, activation signal ACT may be activated/inactivated in accordance with the column address strobe signal /CAS. MOS transistor 68 is provided for setting the output signal of comparing circuit 62 surely at the level of the external power supply voltage extVcc when the activation signal ACT is at the inactive state of L level, to set MOS transistor 66 non-conductive.

The activation signal ACT may be appropriately defined in accordance with the active period of the circuit to which the voltage down converter applies the internal power supply voltage. A structure in which a voltage down converter is provided for each of different groups of circuits having different functions may be used, even when the internal power supply voltage generates the voltages of the same level.

In the following description, "differential amplifying portion" of the voltage down converter refers to a structure including both the comparing circuit and the corresponding MOS transistor operating constantly, and the comparing circuit which is activated in the active cycle time and the MOS transistor supplying current in accordance with the output signal from the comparing circuit.

Figure 7:
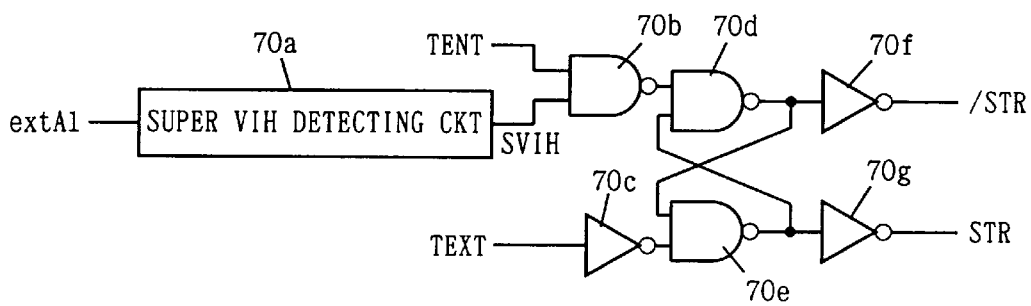
FIG. 7 shows an example of the structure of the stress acceleration mode designating signal generating portion.
Figure 8:
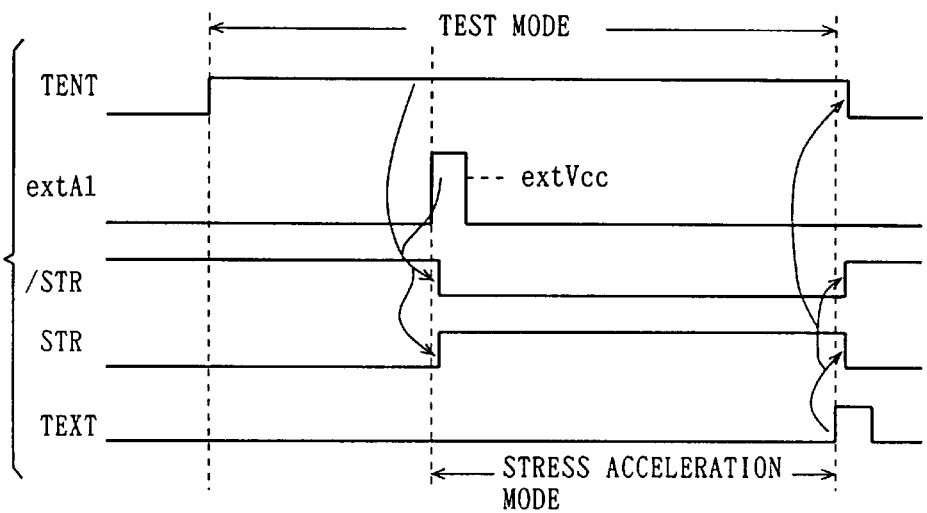
FIG. 8 is a diagram of signal waveforms representing the operation of the circuit shown in FIG. 7.

FIG. 7 shows an example of a structure of the stress acceleration mode designating signal generating portion. Referring to FIG. 7, the stress acceleration mode designating signal generating portion includes: a super VIH detecting circuit 70a detecting the fact that a specific address signal bit extA1 is set at a high voltage level not lower than a prescribed voltage level; an NAND circuit 70b receiving an output signal SVIH from super VIH detecting circuit 70a and the test mode entry signal TENT; an inverter circuit 70c receiving a test mode end signal TEXT; an NAND circuit 70d receiving, at one input, an output signal from NAND circuit 70b; an NAND circuit 70e receiving, at one input, an output signal from inverter circuit 70c; an inverter circuit 70f inverting an output signal from NAND circuit 70d and outputting the stress acceleration mode designating signal /STR; and an inverter circuit 70g inverting an output signal from NAND circuit 70e and outputting the stress acceleration mode designating signal STR. The other inputs and the outputs NAND circuits 70b and 70e are cross coupled.

Super VIH detecting circuit 70a sets its output signal SVIH to an active state of H level when a signal applied to a specific address signal bit input terminal, for example, an external address signal bit extA1, is set at a voltage level sufficiently higher than an H level signal applied in the normal operation mode. The operation of the stress acceleration mode designating signal generating portion shown in FIG. 7 will be described in the following. In a test mode, test mode entry signal TENT is set to the H level. When the specific address signal bit extA1 is at a voltage level not higher than the normal voltage level, the output signal SVIH of super VIH detecting circuit 70a is at the L level, and test mode end signal TEXT is also at the L level. In this state, signals /STR and STR are kept at the reset state of H and L levels, respectively.

When the address signal bit extA1 is set at a voltage level sufficiently higher than the voltage level applied in normal operation (not lower than the level of external power supply voltage extVcc), the output signal SVIH of super VIH detecting circuit 70a rises to the H level. In response, the output signal of NAND circuit 70b attains to the L level and the output signal of NAND circuit 70d attains to the H level. Therefore, the stress acceleration mode designating signal /STR from inverter circuit 70f falls to the L level. NAND circuit 70e receives at both inputs H level signals, outputs an L level signal, and in response, the stress acceleration mode designating signal STR from inverter circuit 70g rises to the H level.

This state is maintained as long as the test mode entry signal TENT is kept at the H level.

When the test mode is completed, test mode end signal TEXT is set and kept at the H level for a prescribed time period, and in response, the output signal from inverter circuit 70c falls to the L level. Consequently, the output signal from NAND circuit 70e attains to the H level, and both inputs of NAND circuit 70d attain to the H level in response, so that the output signal therefrom attains to the L level. Accordingly, the signal STR from inverter circuit 70g falls to the L level, and the signal /STR from inverter circuit 70f rises to the H level, and the stress acceleration mode is completed.

Figure 9:
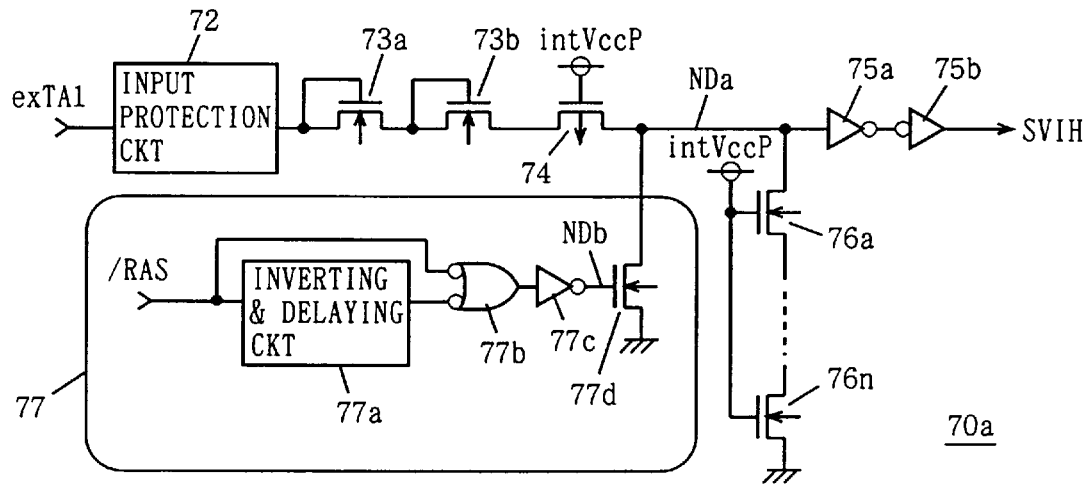
FIG. 9 shows an example of the structure of a super VIH detecting circuit shown in FIG. 7.

FIG. 9 shows an example of the structure of super VIH detecting circuit 70a shown in FIG. 7. Referring to FIG. 9, super VIH detecting circuit 70a includes: an input protection circuit 72 receiving address signal bit extA1; n channel MOS transistors 73a and 73b connected in series with each other and diode connected for lowering the voltage applied through input protection circuit 72 by respective threshold voltages and transmitting the lowered voltage; a p channel MOS transistor 74 receiving at its gate the internal power supply voltage intVccP and transmitting the voltage applied through MOS transistor 73b to a node NDa; an inverter 75a receiving a signal potential on node NDa; an inverter circuit 75b inverting an output signal from inverter 75a and outputting super VIH detecting signal SVIH; and n channel MOS transistors 76a to 76n connected in series between node NDa and the ground node. MOS transistors 76a to 76n have their gates coupled to receive the internal power supply voltage intVccP. Channel resistances of MOS transistors 76a to 76n are made sufficiently high, and MOS transistors 76a to 76n function as pull down resistances.

Figure 10:
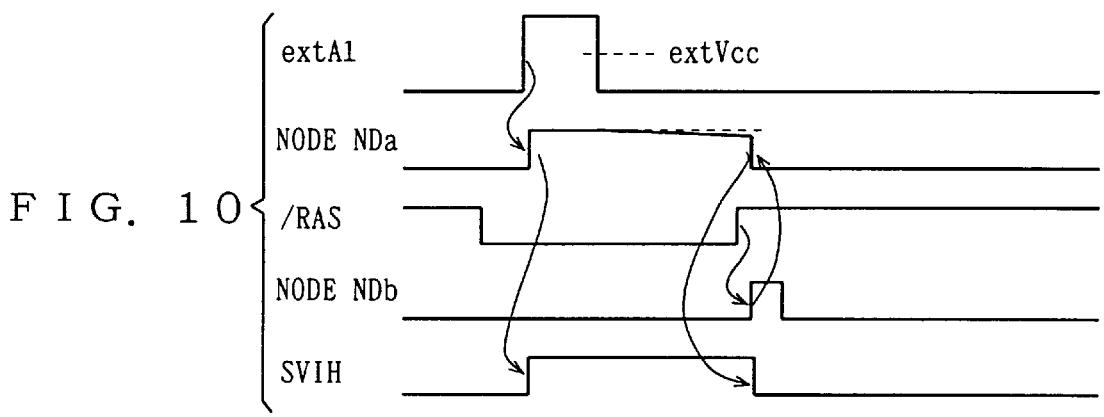
FIG. 10 is a diagram of signal waveforms representing the operation of the circuit of FIG. 9.

Super VIH detecting circuit 70a further includes a reset circuit 77 responsive to the rise of row address strobe signal /RAS for resetting the potential of node NDa to the ground voltage level. The reset circuit 77 includes an inverting and delaying circuit 77a for delaying by a prescribed time period and inverting row address strobe signal /RAS, an NAND circuit 77b receiving an output signal from inverting and delaying circuit 77a and row address strobe signal /RAS, an inverter circuit 77c receiving an output signal from NAND circuit 77b, and an n channel MOS transistor 77d connected between node NDa and the ground node and having its gate connected to receive an output signal from inverter circuit 77c. The operation of super VIH detecting circuit 70a shown in FIG. 9 will be described with reference to the diagram of signal waveforms shown in FIG. 10.

Input protection circuit 720 includes a resistance element and a clamp element, and when a signal applied to the address signal input terminal attains to an abnormal high voltage, it prevents application of the abnormally high voltage to the internal components and prevents flowing in of a large current. When the address signal bit extA1 is at a normal voltage level, MOS transistors 73a and 73b are non-conductive, or transmit a voltage level of a signal applied less the threshold voltages thereof when these are conductive, and transmit the same. The p channel MOS transistor 74 receives at its gate the internal power supply voltage intVccP, and when the voltage level of the signal applied through MOS transistor 73b is lower than the internal power supply voltage intVccP, it is maintained non-conductive. In this state, node NDa has been pulled down to the level of the ground voltage level by MOS transistors 76a to 76n, and the signal SVIH is at the L level.

When the address signal bit extA1 is set to a voltage level sufficiently higher than the normal power supply voltage level, MOS transistors 73a and 73b are rendered conductive, the voltage sufficiently higher than the internal power supply voltage intVccP is transmitted to the source of MOS transistor 74, MOS transistor 74 is rendered conductive, current flows to MOS transistors 76a–76n, and an H level voltage is transmitted to node NDa. Consequently, the super VIH detection signal SVIH from inverter 75b rises to the H level.

When the address signal bit extA1 falls to a voltage level not higher than the normal voltage level and p channel MOS transistor 74 is rendered non-conductive, node NDa is discharged moderately through MOS transistors 76a to 76n having sufficiently high resistance values. When row address strobe signal /RAS is raised from the L level to the H level next, in response to the rise of the row address strobe signal /RAS, a one shot pulse signal is generated at node NDb and MOS transistor 77d is rendered conductive. Current drivability of MOS transistor 77d is made sufficiently larger than that of MOS transistor 74. Node NDa is discharged to the ground voltage level at high speed and, in response, the VIH detection signal SVIH falls to the L level. The row address strobe signal /RAS need not be set to the L level when the super VIH condition is set. When an active cycle is performed in the stress acceleration mode, at the time of completion of the active cycle the row address strobe signal /RAS rises to the H level. Therefore, what is necessary is that the reset circuit 77 is activated and resets the node NDa to the ground voltage level at the completion of one active cycle.

Figure 11:
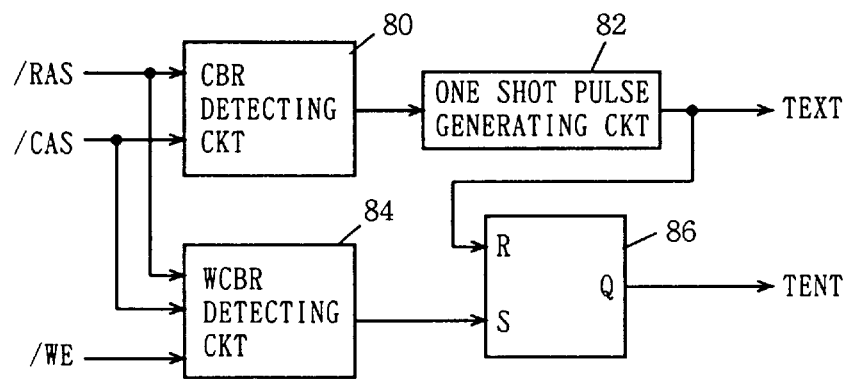
FIG. 11 schematically shows the structure of a test mode entry signal and test end signal generating portion of FIG. 7.

FIG. 11 schematically shows the structure of test mode control signal generating portion. In FIG. 11, the test mode control signal generating portion includes: a CBR detecting circuit 80 receiving row address strobe signal /RAS and column address strobe signal /CAS and detects satisfaction of a CBR condition; a one shot pulse generating circuit 82 for generating a one shot pulse having a prescribed time width in accordance with the CBR detection signal from CBR detecting circuit 80; a WCBR detecting circuit 84 receiving row address strobe signal /RAS, column address strobe signal /CAS and write enable signal /WE and detecting satisfaction of the WCBR condition; and a set priority type set/reset flipflop 86 which is set in response to WCBR detection signal from WCBR detecting circuit 84 and is reset in response to the one shot pulse from one shot pulse generating circuit 82. From one shot pulse generating circuit 82, the test mode end signal TEXT is output, and from an output Q from set/reset flipflop 86, the test mode entry signal TENT is output.

The CBR condition refers to the condition in which column address strobe signal /CAS falls to the L level at an earlier timing than the fall of row address strobe signal /RAS. WCBR condition refers to a condition in which both write enable signal /WE and column address strobe signal /CAS are set to the L level at an earlier timing than row address strobe signal /RAS falls.

In the structure of the test mode control portion shown in FIG. 11, when CBR condition is satisfied, the test mode entry signal TENT output from flipflop 86 attains to the active state of H level. When CBR condition is satisfied in this state, the test mode end signal TEXT from one shot pulse generating circuit 82 is set to the active state of H level, and in response, the test mode entry signal TENT from flipflop 86 attains to the L level of inactive state. When WCBR condition is set, the CBR condition is also satisfied. However, the set/reset flipflop 86 is of set priority type, and therefore it is surely set when the WCBR condition is set. The signal /WE may be applied to CBR detecting circuit 80.

In an integrated circuit device such as a semiconductor device, it is necessary to perform normal function test other than stress acceleration mode after the semiconductor chip is mounted in a package. In order to perform test mode operation other than the stress acceleration mode, such as burn in mode, the test mode period is set by the WCBR and CBR conditions. When the test mode entry signal TENT is at the active state of H level and a specific address signal bit extA1, for example, is set to a state satisfying the super VIH condition, the stress acceleration mode is performed.

Figure 12:
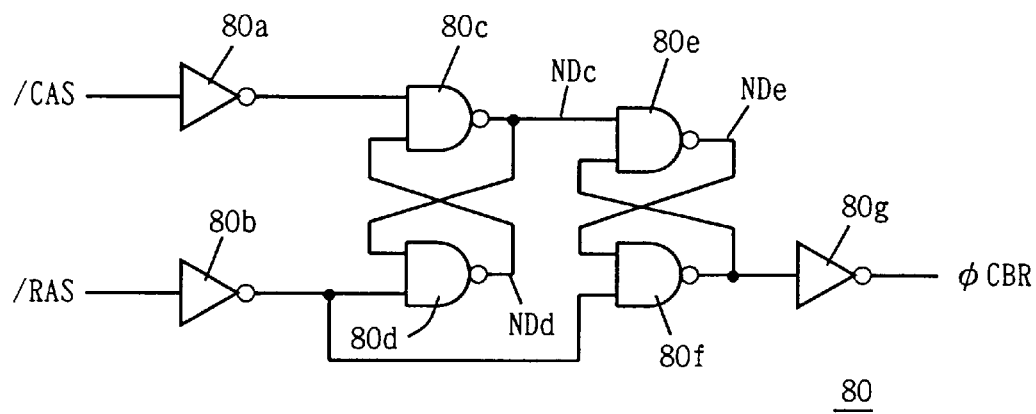
FIG. 12 shows an example of the structure of a CBR detecting circuit shown in FIG. 11.

FIG. 12 shows an example of the structure of CBR detecting circuit 80 shown in FIG. 11. Referring to FIG. 12, CBR detecting circuit 80 includes an inverter circuit 80a receiving column address strobe signal /CAS, an inverter circuit 80b receiving row address strobe signal /RAS, an NAND circuit 80c receiving at one input an output signal from inverter 80a, and an NAND circuit 80b receiving at one input an output signal from inverter circuit 80b. The other input of NAND circuit 80c is coupled to an output of NAND circuit 80d, and the other input of NAND circuit 80d is coupled to the output of NAND circuit 80c.

Figure 13:
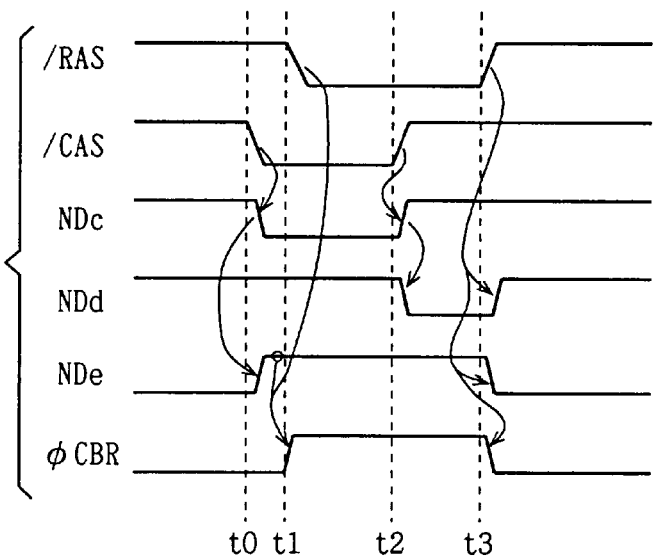
FIG. 13 is a diagram of signal waveforms representing the operation of the CBR detecting circuit of FIG. 12.

CBR detecting circuit 80 further includes an NAND circuit 80e receiving at one input an output signal from NAND circuit 80c, and an NAND circuit 80f receiving at one input an output signal from inverter circuit 80b. The other input of NAND circuit 80e is coupled to the output of NAND circuit 80f, and the other input of NAND circuit 80f is coupled to the output of NAND circuit 80e. From an inverter circuit 80g receiving an output signal from NAND circuit 80f, CBR detection signal φCBR is output. The operation of the CBR detecting circuit 80 shown in FIG. 12 will be described with reference to the diagram of waveforms of FIG. 13.

Before time t0, row address strobe signal /RAS and column address strobe signal sCAS are both at the H level. In this state, output signal from inverter circuits 80a and 80b are at the L level, and output node NDc of NAND circuit 80c and output node NDd of NAND circuit 80d are at the H level. The output signal from NAND circuit 80f is at the H level, both inputs to NAND circuit 80e attain to the H level, and node NDe is at the L level. The CBR detection signal φCBR from inverter circuit 80g i s at the L level.

At time t0, when column address strobe signal /CAS falls to the L level, the volt age level of node NDc falls to the L level in response. As the voltage level of node NDc lowers, the voltage level of output node NDe of NAND circuit 80e rises to H level. In this state, row address strobe signal /RAS is still at the H level, and CBR detection signal φCBR is maintained at the L level.

At time t1, when row address strobe signal /RAS falls to the L level, the output signal from inverter circuit 80b attains to the H level, the output signal from NAND circuit 80f attains to the L level, and in response, CBR detection signal φCBR rises to the H level.

At time t2, when column address strobe signal /CAS rises from the L level to the H level, the output signal from inverter circuit 80a attains to the L level, and in response, the voltage level of output node NDc of NAND circuit 80c rises to the H level. In response to the rise of the voltage level of node NDc, both inputs of NAND circuit 80d attain to the H level, and the voltage level of node NDd falls to the L level. In this state, the voltage level of node NDe does not change yet, and CBR detection signal φCBR is maintained at the H level.

At time t3, when row address strobe signal /RAS is raised to the H level, the output signal of inverter circuit 80b falls to the L level and the voltage level of node NDd rises to the H level. The output signal from NAND circuit 80f attains to the H level, the voltage level of node NDe falls to the L level, and the CBR detection signal φCBR from inverter circuit 80g falls to the L level.

The WCBR detecting circuit 84 shown in FIG. 12 is implemented by applying an output signal of an OR circuit receiving write enable signal /WE and column address strobe signal /CAS to inverter circuit 80a, in the structure shown in FIG. 12. As for one shot pulse generating circuit 82, similar structure as one shot pulse generating circuit of reset circuit 77 shown in FIG. 9 may be utilized.

As described above, by using WCBR condition and CBR condition in the test mode, and by super VIH condition of external pin terminal such as a specific address pin for setting stress acceleration mode for reliability evaluation, necessary test modes can be set without providing an extra pin terminal used only for testing.

As described above, according to the first embodiment of the present invention, reference voltages having different voltage levels are generated, and internal power supply voltages in accordance with the reference voltage levels are transmitted to internal power supply lines provided separately in accordance with the reference voltages. Therefore, circuits which should operate at high speed can operate at high speed, and circuit which should operate with low current consumption can operate with low current consumption.

Further, since an external power supply voltage is supplied at the time of stress acceleration mode to the output node of the reference voltage generating circuit, it is possible to perform voltage stress acceleration for comparing circuits and reference voltage generating circuits, and therefore it is possible to perform stress acceleration mode operation of voltage down converters to evaluate reliability thereof.

By interconnecting pads which are connected to separately provided power supply pin terminals, it is possible to disperse and absorb noise and surge voltages generated on the pads in the external power supply lines, and therefore power supply lines having superior noise and surge resistances can be realized.

Second Embodiment

Figure 14:
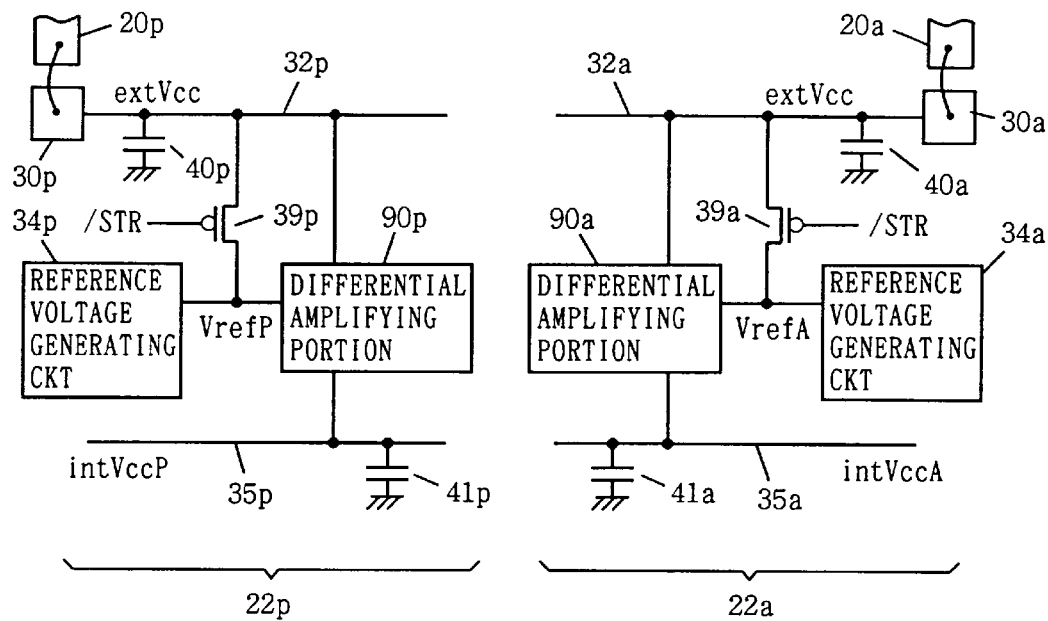
FIG. 14 schematically shows the structure of the internal power supply voltage generating circuit in accordance with a second embodiment of the present invention.

FIG. 14 schematically shows the structure of the internal power supply voltage generating circuit in accordance with the second embodiment of the present invention. In the structure shown in FIG. 14, to a power supply pad 30p connected to an external power supply terminal 20p, an external power supply line 32p is connected, and to a power supply pad 30a connected to external power terminal 20a, an external power supply line 32a is connected. External power supply lines 32p and 32a are separated from each other. Stabilizing capacitors 40p and 40a are connected to external power supply lines 32p and 32a, respectively.

The peripheral voltage down converter 22p includes: a reference voltage generating circuit 34p which operates using the external power supply voltage extVcc from external power supply line 32p as one operational power supply voltage and generates a reference voltage VrefP of voltage VrefP of a prescribed voltage level; a differential amplifier 90p for differentially amplifying reference voltage VrefP output from reference voltage generating circuit 34p and an internal power supply voltage intVccP on an internal power supply line 35p, and setting the internal power supply voltage intVccP to the level of the reference voltage VrefP in accordance with the result of the differential amplification; and a p channel MOS transistor 39p which is rendered conductive in response to activation of stress acceleration mode designating signal /STR for connecting the output node of reference voltage circuit 34p to external power supply line 32p. Differential amplifying portion 90p has a structure shown in FIG. 6, and it includes a circuit for holding the internal power supply voltage intVccP at the reference voltage level at the standby cycle, and a circuit portion activated in the active cycle for holding the internal power supply voltage intVccP at the reference voltage VrefP.

The array voltage down converter 22a includes: a reference voltage generating circuit 34a which operates using the external power supply voltage on external power supply line 32a as one operational power supply voltage and generates a reference voltage VrefA of a prescribed voltage level; a differential amplifying portion 90a for differentially amplifying the reference voltage VrefA and the internal power supply voltage intVccA on internal power supply line 35a, supplying current from external power supply line 32a to internal power supply line 35a in accordance with the result of differential amplification for holding the internal power supply voltage intVccA at the level of the reference voltage VrefA; and a p channel MOS transistor 39a which is rendered conductive when stress acceleration mode designating signal /STR is activated, for connecting the output node of reference voltage generating circuit 34a to external power supply line 32a. The differential amplifying portion 90a has a similar structure as that shown in FIG. 6. Stabilizing capacitors 41p and 41a are connected to internal power supply lines 35p and 35a, respectively.

The structure of the internal power supply voltage generating circuit shown in FIG. 14 is substantially the same as that of internal power supply voltage generating circuit shown in FIG. 3 except that the external power supply line is divided into the external power supply line 32p for peripheral circuitry and the external power supply line 32a for the array circuitry.

Figure 15:
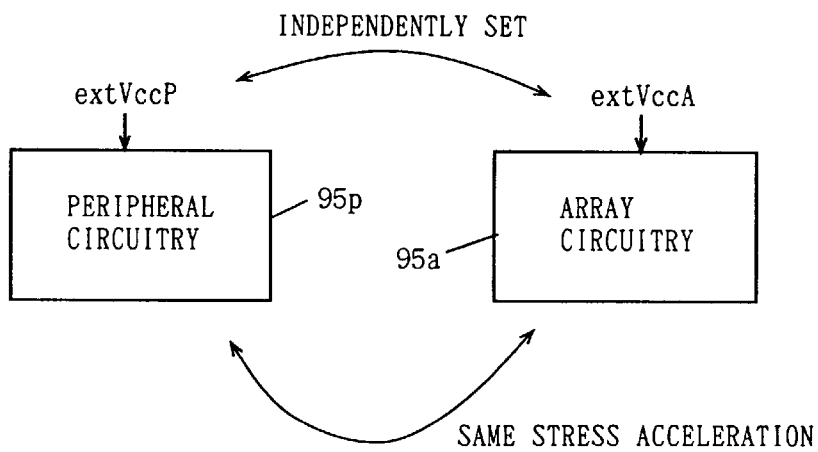
FIG. 15 is an illustration showing the effect of the internal power supply voltage generating circuit of FIG. 14.

In accordance with the structure shown in FIG. 14, at the time of stress acceleration mode, it is possible to set voltage level of the external power supply voltage extVcc on external power supply line 32p independently from the voltage level of external power supply voltage extVcc on the external power supply line 32a. Therefore, as shown in FIG. 15, it is possible to independently set the external power supply voltage extVccP applied to the peripheral circuitry 95p and the voltage level of external power supply voltage extVccA applied to the array circuitry 95a at the time of stress acceleration mode, and to make voltage stress acceleration conditions for the peripheral circuitry 95p and array circuitry 95a equal to each other. Therefore, reliability evaluation of the semiconductor memory device can be performed precisely.

Here, the peripheral circuitry 95p includes the row decoder, the column decoder and the clock generating circuit, while array circuitry includes the sense amplifiers and the input/output circuit.

As described above, according to the second embodiment of the present invention, since power supply lines for the peripheral circuitry and the array circuitry are provided separate from each other, it is possible to set the acceleration voltages applied to the peripheral circuitry and array circuitry independent from each other, voltage stress conditions for the peripheral circuitry and the array circuitry in the semiconductor memory device can be accelerated at the same rate, and therefore test for performance evaluation such as burn in can be performed correctly.

Third Embodiment

Figure 16:
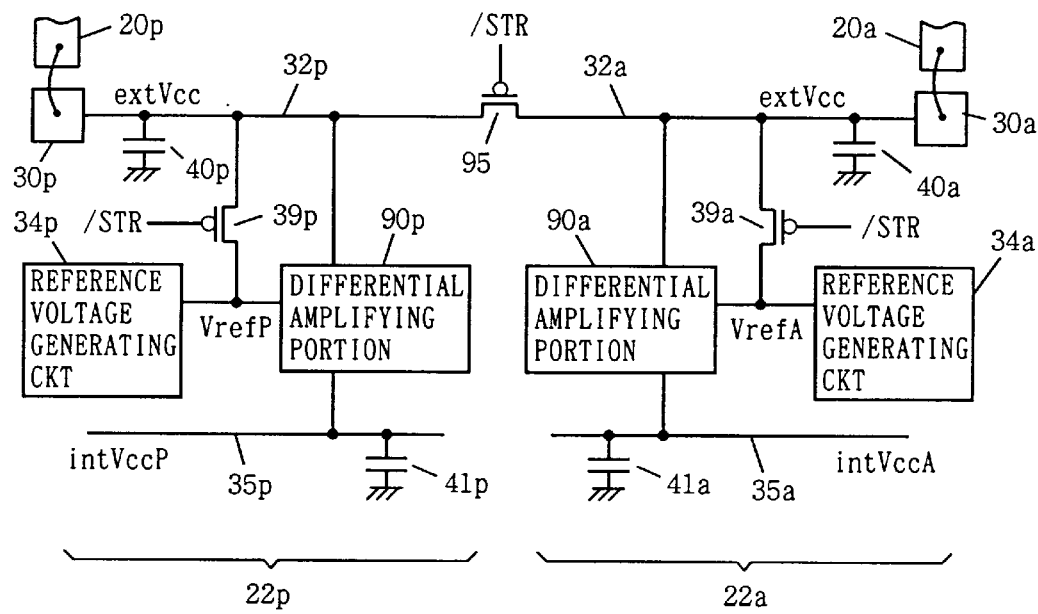
FIG. 16 schematically shows a structure of the internal power supply voltage generating circuit in accordance with a third embodiment of the present invention.

FIG. 16 schematically shows the structure of the internal power supply voltage generating circuit in accordance with the third embodiment of the present invention. The structure of the internal power supply voltage generating circuit shown in FIG. 16 differs from the structure of FIG. 14 in that between external power supply lines 32p and 32a, a p channel MOS transistor 96 which is responsive to the stress acceleration mode designating signal /STR is provided. Except this point, it is the same as the structure shown in FIG. 14, and therefore corresponding portions are denoted by the same reference characters and detailed description thereof is not repeated. The p channel MOS transistor 96 provided between external power supply lines 32p and 32a is rendered non-conductive in the stress acceleration operation mode, and is rendered conductive in other operation modes.

Figure 17A:
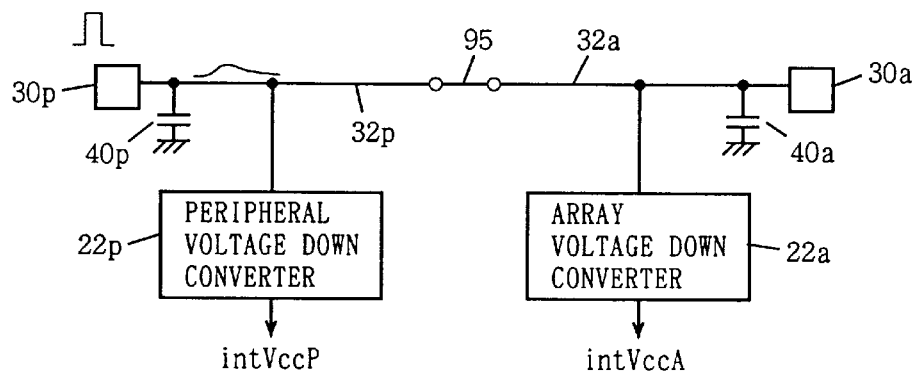
FIGS. 17A and 17B show a manner of connection of external power supply lines of the internal power supply voltage generating circuit shown in FIG. 16.

As shown in FIG. 17A, in the operation mode other than stress acceleration mode, the stress acceleration mode designating signal /STR is at L level and the MOS transistor 96 is conductive. In this state, external power supply lines 32p and 32a are electrically connected, and capacitance of external power supply line arranged between power supply pads 30p and 30a increases. Therefore, when a large surge voltage is applied to external power supply pad 30p, the charges can be dispersed over the external power supply lines 32p and 32a. Therefore, application of a high electric field because of the surge voltage to external power supply lines 32p and 32a can be prevented, ensuring reliability of the external power supply line.

Further, since stabilizing capacitors 40p and 40a are connected to these external power supply lines 32p and 32a, the charges applied by the surge voltage, for example, are absorbed by the capacitors 40p and 40a, and accordingly, increase in voltage level of the external power supply line can be suppressed and the electric field of the external power supply line can be relaxed (charges Q is given by the product of capacitance C and voltage V: Q=C·V).

Figure 17B:
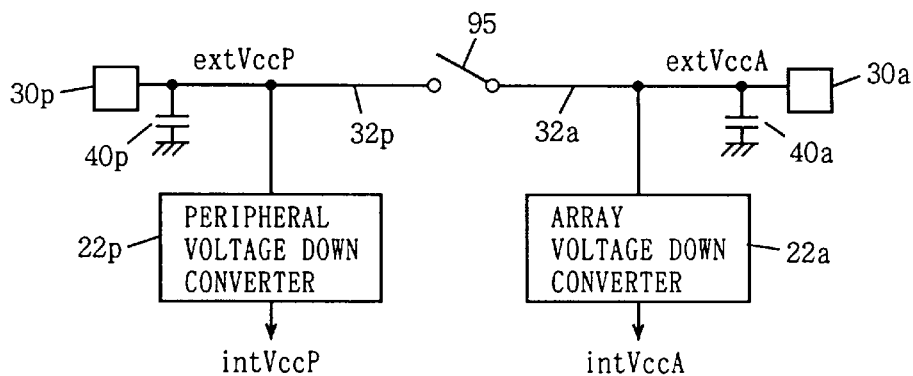

Meanwhile, in the stress acceleration mode, as shown in FIG. 17B, the stress acceleration mode designating signal /STR attains to the H level, and MOS transistor 96 is rendered non-conductive. In this state, external power supply lines 32p and 32a are separated from each other. Therefore, it is possible to apply external power supply voltages extVccP and extVccA having mutually different voltage levels to power supply pads 30p and 30a, respectively. Accordingly, as in the second embodiment, it is possible to operate the peripheral circuitry and the array circuitry under the same acceleration condition, ensuring reliability evaluation.

As described above, according to the third embodiment of the present invention, an MOS transistor which is rendered conductive/non-conductive in response to the stress acceleration mode designating signal is arranged between the external power supply line for the peripheral circuitry and the external power supply line for the array circuitry, and therefore in the stress acceleration mode, the peripheral circuitry and the array circuitry can be operated under the same acceleration condition, and highly reliable stress acceleration mode test becomes possible. Other than the stress acceleration mode, the power supply lines are electrically connected, and because of the high parasitic capacitance thereof, even when a high voltage surge is applied, for example, the surge voltage can be dispersed and absorbed, realizing highly reliable external power supply line. Not only the high voltage surge but also normal noise generated on the external power supply line can be absorbed as well, and therefore an external power supply line with small variation of external power supply voltage can be realized.

Fourth Embodiment

Figure 18:
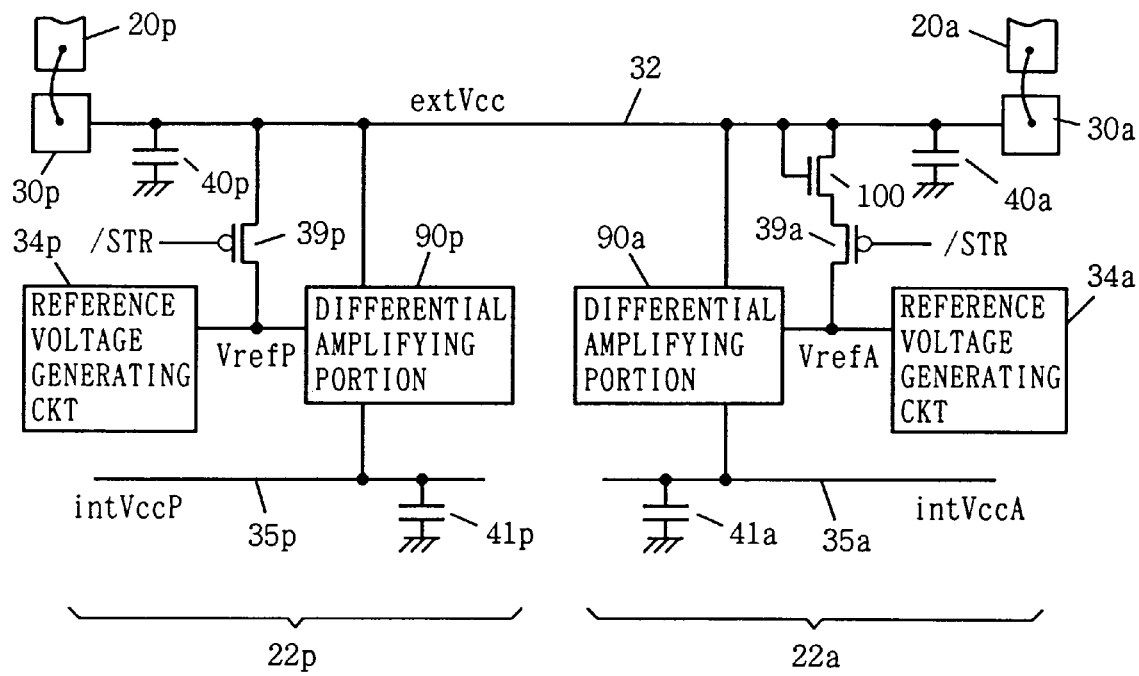
FIG. 18 schematically shows a structure of the internal power supply voltage generating circuit in accordance with a fourth embodiment of the present invention.

FIG. 18 schematically shows a structure of the internal power supply voltage generating circuit in accordance with the fourth embodiment of the present invention. In the structure of the internal power supply voltage generating circuit shown in FIG. 18, power supply pads 30p and 30a connected to external power supply terminals 20p and 20a are connected to each other by an external power supply line 32. In an array voltage down converter 22a, an n channel MOS transistor 100 is provided between p channel MOS transistor 39a receiving at its gate the stress acceleration mode designating signal /STR and the external power supply line 32. The n channel MOS transistor 100 has its gate connected to external power supply line 32 and functions as a diode. Except these points, the structure is the same as that shown in FIG. 16. Therefore, corresponding portions are denoted by the same reference characters and detailed description thereof is not repeated.

In the structure shown in FIG. 18, in the stress acceleration mode, MOS transistors 100 and 39a are rendered conductive, and the voltage level of reference voltage generating circuit 34a attains to extVcc-Vth, where Vth represents the threshold voltage of MOS transistor 100. Meanwhile, in peripheral voltage down converter 22p, in the stress acceleration mode, the output node of reference voltage generating circuit 34p is set at the voltage level of external power supply voltage extVcc by p channel MOS transistor 39p. Therefore, when the threshold voltage Vth of MOS transistor 100 is set equal to intVccP-intVccA, for example, it is possible to set the difference between the power supply voltage of the peripheral circuitry and the power supply voltage for the array circuitry in the stress acceleration mode the same as that of normal operation cycle, and therefore the voltage stress acceleration condition in the integrated circuit device can be made approximately uniform.

Especially when the acceleration condition is represented by the ratio of power supply voltages in the normal operation mode and the stress acceleration mode, the degree of acceleration of the voltage stress condition for the array circuitry and the peripheral circuitry can be made equal, when the threshold voltage Vth is set in accordance with the following equation.

$$Vth=extVcc \cdot (1-intVccA/intVccP)$$

In the structure shown in FIG. 18, the external power supply line 32 extends between power supply pads 30p and 30a to connect pads 30a and 30p to each other, and therefore a power supply line strong against noise can be realized.

The position of connection of MOS transistors 100 and 39a may be exchanged.

When the internal power supply voltage intVccP for the peripheral circuitry is near the external power supply voltage extVcc, it is possible to set the voltage stress acceleration condition for the peripheral circuitry and the array circuitry equal to each other, even when the threshold voltage Vth of MOS transistor 100 is set to the difference between internal power supply voltage intVccP and intVccA.

As described above, according to the fourth embodiment of the present invention, in the stress acceleration mode, the external power supply voltage is lowered and transmitted to the output node of the reference voltage generating circuit for the array circuitry. Therefore, the difference between the power supply voltage applied to the peripheral circuitry and the power supply voltage applied to the array circuitry in the stress acceleration mode can be made approximately the same as that in the normal operation mode, uniform stress acceleration in the device is realized, and therefore highly reliable reliability evaluation test becomes possible.

Fifth Embodiment

Figure 19:
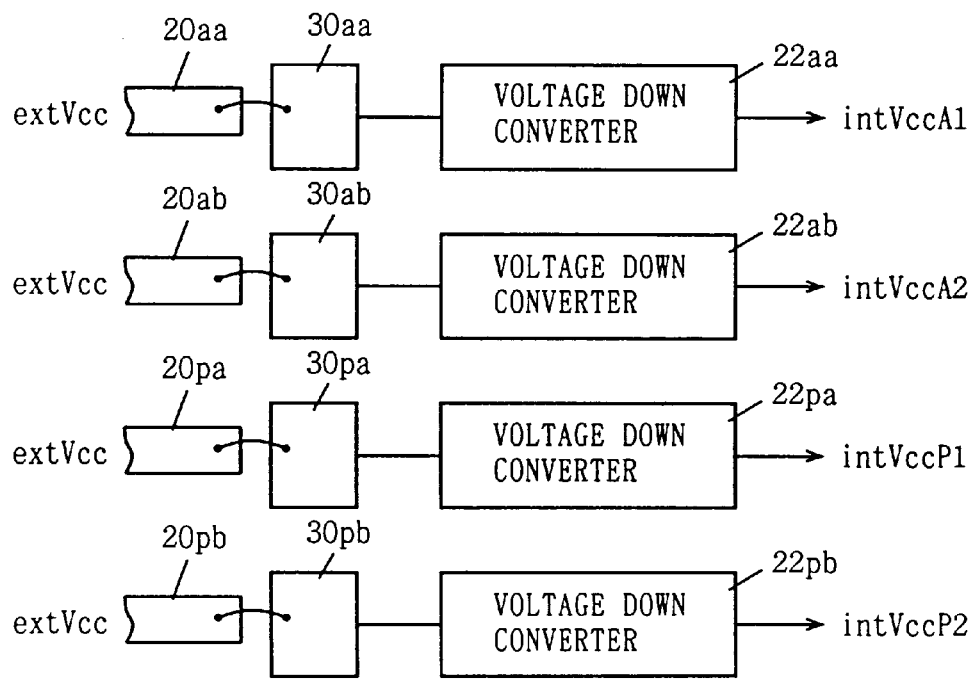
FIG. 19 schematically shows a structure of the internal power supply voltage generating circuit in accordance with a fifth embodiment of the present invention.
Figure 20:
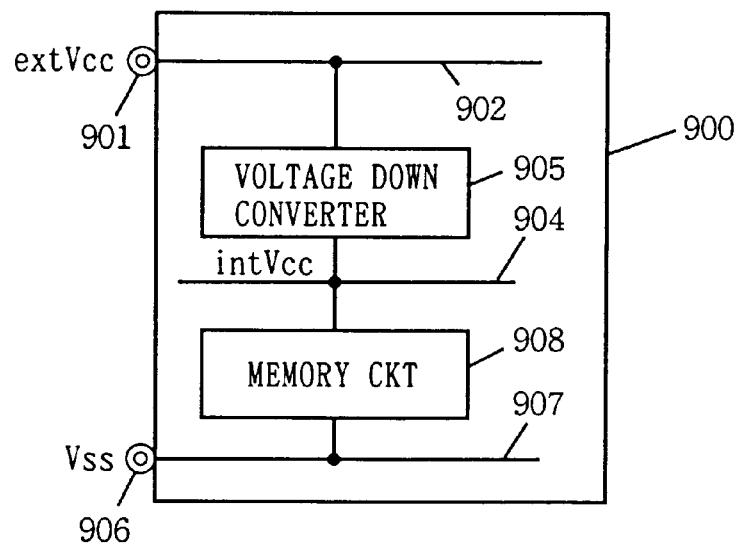
FIG. 20 schematically shows the overall structure of a conventional semiconductor integrated circuit device.
Figure 21:
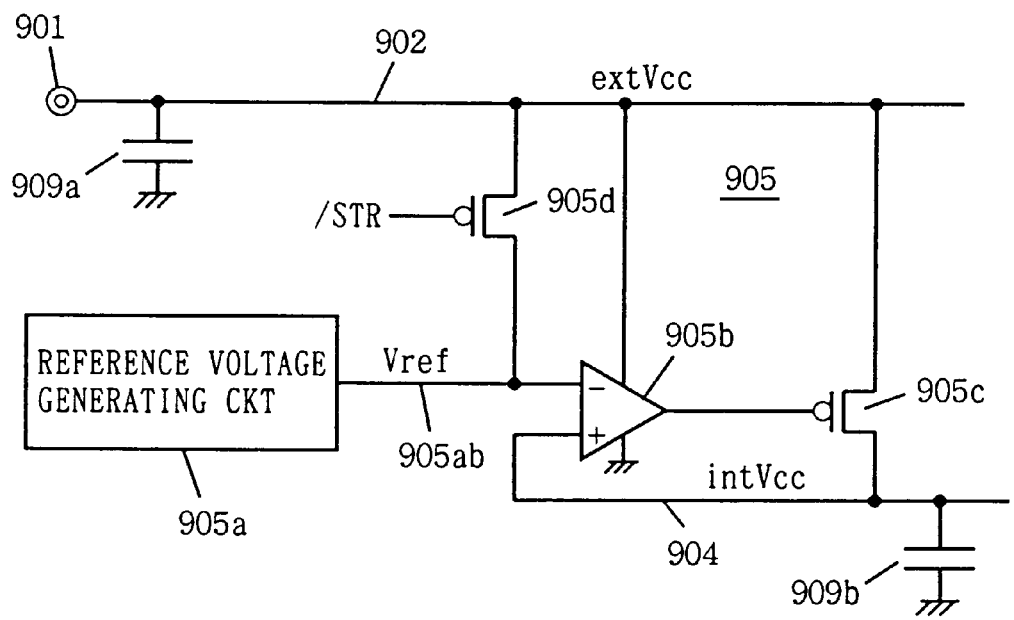
FIG. 21 schematically shows the structure of the voltage down converter shown in FIG. 20.
Figure 22:
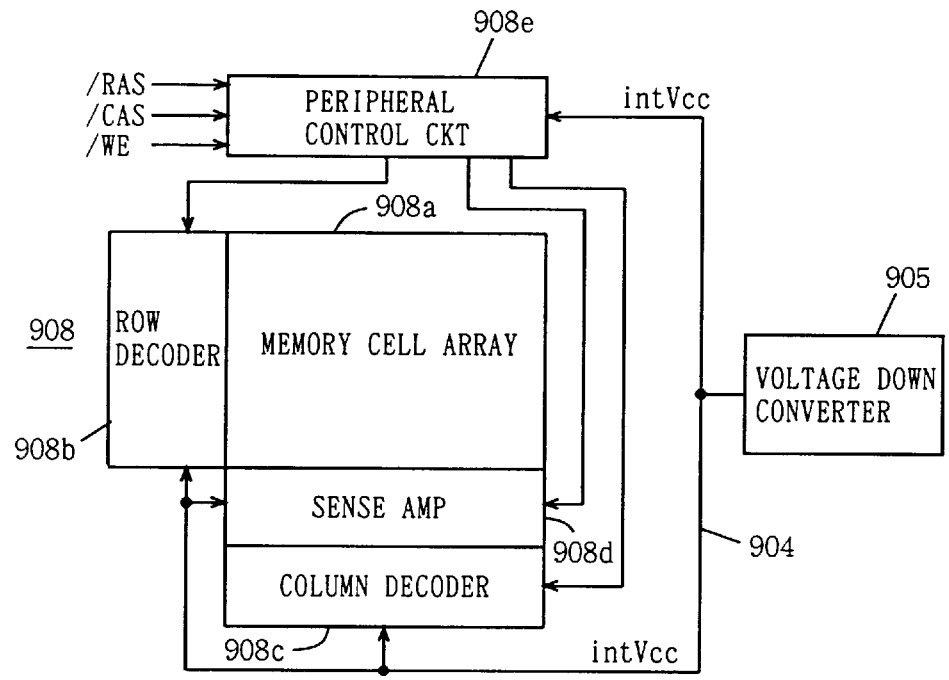
FIG. 22 schematically shows the structure of the memory circuit shown in FIG. 20.

FIG. 19 schematically shows a structure of an internal power supply voltage generating circuit in accordance with the fifth embodiment of the present invention. Referring to FIG. 19, for external power supply terminals 20aa, 20ab, 20pa and 20pb, power supply pads 30aa, 30ab, 30pa and 30pb are provided, respectively. For the power supply pads 30aa, 30ab, 30pa and 30pb, voltage down converters 22aa, 22ab, 22pa and 22pb are provided. The voltage down converters 22aa, 22ab, 22pa and 22pb can have any of the structures shown in the first to fourth embodiments above. Voltage down converter 22aa generates an array internal power supply voltage intVccAl, voltage down converter 22ab generates an array internal power supply voltage intVccA2, voltage down converter 22pa generates a peripheral internal power supply voltage intVccP1, and voltage down converter 22pb generates a peripheral internal power supply voltage intVccP2. For example, the array internal power supply voltage intVccA1 is applied to the sense amplifier, and the array internal power supply voltage intVccA2 is applied to the input/output circuit. The internal power supply voltage intVccP1 is applied to the clock generating circuit and column/row decoder, and the internal power supply voltage intVccP2 is applied to the input/output buffer. By adjusting levels of the internal power supply voltages in accordance with characteristics of respective circuits, it is possible to realize a semiconductor memory device having superior current consumption characteristic and high speed operation.

As described above, in accordance with the fifth embodiment of the present invention, voltage down converters generating internal power supply voltages of mutually different voltage levels are provided for a plurality of external power supply terminals, respectively. Therefore, in accordance with the operational characteristics of internal circuitry, the corresponding internal power supply voltage levels can be set at optimal values, and therefore a semiconductor memory device can be provided which realizes high speed operation and low current consumption.

Other Applications

In the foregoing, a dynamic random access memory (DRAM) has been described as an example of the semiconductor integrated circuit device. However, the present invention is also applicable to any integrated circuit device having a voltage down converter down converting an external power supply voltage to generate an internal power supply voltage.

Further, the stress acceleration mode may be any test for reliability evaluation such as burn in mode and life test.

As described above, according to the present invention, voltage down converters generating internal power supply voltages of mutually different voltage levels are provided corresponding to external power supply pads respectively, and the output node of a reference voltage generating circuit determining the internal power supply voltage level is adapted to be electrically connected to the corresponding external power supply node at the time of stress acceleration mode. Therefore, the voltage level of the internal power supply voltage can be set in accordance with the characteristic of the circuit which uses the corresponding internal power supply voltage, and therefore a semiconductor integrated circuit device enabling high speed operation and low current consumption can be realized. Further, since the output node of the reference voltage generating circuit is coupled to the external power supply voltage node in the stress acceleration mode, stress acceleration test of the voltage down converter is also possible, and hence reliability evaluation of the semiconductor integrated circuit device can surely be performed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device, comprising:
   a first reference voltage generating circuit coupled to a first power supply node, and supplied with current from said first power supply node for generating a first reference voltage;
   a second reference voltage generating circuit coupled to a second power supply node and supplied with current from said second power supply node for generating a second reference voltage of a level different from said first reference voltage;
   a first comparing circuit operating using a voltage of said first power supply node as one operational power supply voltage, and comparing a voltage at an output node of said first reference voltage generating circuit with a voltage on a first internal power supply line;
   a first current drive element coupled between said first power supply node and said first internal power supply line for supplying current from said first power supply node to said first internal power supply line in accordance with an output signal from said first comparing circuit;
   first switching element coupled between said first power supply node and the output node of said first reference voltage generating circuit, and responsive to activation of a stress acceleration mode designating signal for electrically coupling said output node of said first reference voltage generating circuit with said first power supply node;
   a second comparing circuit for comparing a voltage of an output node of said second reference voltage generating circuit with a voltage of a second internal power supply line provided separate from said first internal power supply line;
   a second current drive element coupled between said second power supply node and said second internal power supply line, for supplying current from said second power supply node to said second internal power supply line in accordance with an output signal from said second comparing circuit; and
   a second switching element coupled between said second power supply node and the output node of said second reference voltage generating circuit, and responsive to activation of said stress acceleration mode designating signal for electrically coupling said second power supply node and said output node of said second reference voltage generating circuit.

2. The semiconductor integrated circuit device according to claim 1, wherein
   the first and second power supply nodes are coupled to external power supply terminals each receiving an external power supply voltage and provided separate from other, and said first and second power supply nodes are connected to each other by a power supply interconnection line.

3. The semiconductor integrated circuit device according to claim 1, wherein
   the first and second power supply nodes are coupled to external power supply terminals each receiving an external power supply voltage and provided separate from other, and said first and second power supply nodes are separated from each other.

4. The semiconductor integrated circuit device according to claim 1, further comprising
   a third switching element coupled between said first power supply node and said second power supply node, rendered non-conductive in response to activation of said stress acceleration mode designating signal, and rendered conductive in response to inactivation of said stress acceleration mode designating signal.

5. The semiconductor integrated circuit device according to claim 2, wherein said first switching element includes means for lowering by a prescribed value the voltage on said first power supply node for transmission to output node of said first reference voltage generating circuit, when said stress acceleration mode designating signal is activated.

6. The semiconductor integrated circuit device according to claim 1, further comprising a memory array having a plurality of memory cells arranged in a matrix of rows and columns;

a sense amplifier provided corresponding to each column of said memory array, operating using the voltage on said first internal power supply line as one operational power supply voltage when activated, for sensing and amplifying memory cell data on the corresponding column, and selecting means operating using the voltage of said second internal power supply line as one operational power supply voltage, for selecting an addressed memory cell of said memory cell array in accordance with an address signal.

7. The semiconductor integrated circuit device according to claim 1, wherein said first comparing circuit operates constantly.

8. The semiconductor integrated circuit device according to claim 1, wherein said first comparing circuit is made inactive in response to an inactivation of a control signal designating an activation of circuitry using the voltage on said first internal power supply line.

9. The semiconductor integrated circuit device according to claim 1, wherein said second comparing circuit operates constantly.

10. The semiconductor integrated circuit device according to claim 1, wherein said second comparing circuit is made inactive in response to inactivation of a control signal designating an activation of circuitry using the voltage on said second internal power supply line.

11. A semiconductor integrated circuit device, comprising:

a plurality of internal power supply lines arranged separate from each other;

a plurality of reference voltage generating means provided corresponding to said plurality of internal power supply lines respectively, for generating reference voltages of mutually different voltage levels from external power supply voltage on corresponding external power supply voltage supplying nodes;

a plurality of internal voltage generating means provided corresponding to said plurality of reference voltage generating means respectively, each differentially amplifying a reference voltage from a corresponding reference voltage generating means and a voltage on a corresponding internal power supply line, adjusting the voltage of the corresponding internal power supply line in accordance with result of amplification, and for maintaining the voltage of the corresponding internal power supply line at a voltage level of a corresponding reference voltage output node; and means responsive to a stress acceleration mode designation signal for coupling respective reference voltage output nodes of said plurality of reference voltage generating means to the corresponding external power supply voltage supplying nodes.

12. The semiconductor integrated circuit device according to claim 11, further comprising a plurality of external pin terminals provided corresponding to respective external power supply voltage supply nodes and receiving externally applied power supply voltages for transmission to corresponding external power supply voltage supplying nodes.

13. The semiconductor integrated circuit device according to claim 12, further comprising an interconnection line interconnecting the external power supply voltage supplying nodes.

14. The semiconductor integrated circuit device according to claim 12, further comprising connecting means for interconnecting the external power supply voltage supplying nodes with each other in response to an inactivation of a stress acceleration mode designating signal and for isolating the external power supply voltage supplying nodes from each other in response to an activation of the stress acceleration mode designating signal.

15. The semiconductor integrated circuit device according to claim 12, wherein the external power supply voltage supplying nodes are isolated from each other.

* * * * *

UNITED STATES PATENT AND TRADEMARK OFFICE
CERTIFICATE OF CORRECTION

PATENT NO. : 5,917,765
DATED : June 29, 1999
INVENTOR(S) : Fukashi MORISHITA, et al It is certified that error appears in the above-identified patent and that said Letters Patent is hereby corrected as shown below:

IN THE CLAIMS:
Column 28, line 24,
Claim 12, line 4, change "supply nodes" to --supplying nodes--.

Signed and Sealed this

Fourth Day of January, 2000

Attest:

*Attesting Officer*     *Acting Commissioner of Patents and Trademarks*